United States Patent
Chen et al.

(10) Patent No.: US 10,269,435 B1
(45) Date of Patent: Apr. 23, 2019

(54) REDUCING PROGRAM DISTURB BY MODIFYING WORD LINE VOLTAGES AT INTERFACE IN TWO-TIER STACK AFTER PROGRAM-VERIFY

(71) Applicant: SanDisk Technologies LLC, Plano, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/814,769

(22) Filed: Nov. 16, 2017

(51) Int. Cl.
*G11C 16/26* (2006.01)
*H01L 27/11529* (2017.01)

(52) U.S. Cl.
CPC ........ *G11C 16/26* (2013.01); *H01L 27/11529* (2013.01)

(58) Field of Classification Search
CPC .................... G11C 16/26; H01L 27/11529
See application file for complete search history.

(56) References Cited

U.S. PATENT DOCUMENTS

| | | | |
|---|---|---|---|
| 7,623,386 B2 | 11/2009 | Dong et al. | |
| 9,093,157 B2 | 7/2015 | Kwak et al. | |
| 9,286,987 B1 | 3/2016 | Dong et al. | |
| 9,286,994 B1 | 3/2016 | Chen et al. | |
| 9,336,892 B1 | 5/2016 | Chen et al. | |
| 9,466,369 B1 | 10/2016 | Pang et al. | |
| 9,530,506 B2 | 12/2016 | Rabkin et al. | |
| 9,640,273 B1 | 5/2017 | Chen et al. | |
| 9,691,781 B1 | 6/2017 | Nishikawa et al. | |
| 2007/0291545 A1 | 12/2007 | Mokhlesi | |
| 2008/0049502 A1* | 2/2008 | Byeon ................ | G11C 16/0483 365/185.05 |
| 2009/0046507 A1* | 2/2009 | Aritome ............. | G11C 16/3418 365/185.02 |
| 2011/0157997 A1* | 6/2011 | Kamigaichi ........ | G11C 11/5628 365/185.22 |
| 2011/0299331 A1* | 12/2011 | Kim ................... | G11C 16/0483 365/185.02 |
| 2013/0107629 A1 | 5/2013 | Shim et al. | |
| 2013/0182502 A1 | 7/2013 | Cheo et al. | |

(Continued)

OTHER PUBLICATIONS

U.S. Appl. No. 15/678,683, filed Aug. 16, 2017, by Chen et al.

(Continued)

*Primary Examiner* — Khamdan N. Alrobaie
(74) *Attorney, Agent, or Firm* — Vierra Magen Marcus LLP

(57) ABSTRACT

A memory device and associated techniques for reducing program disturb of memory cells which are formed in a two-tier stack with an increased distance between memory cells at an interface between the tiers. After a verify test in a program loop, a different timing is used for decreasing the word line voltages of the interface memory cells compared to the remaining memory cells. In one aspect, the start of the decrease of the word line voltages of the interface memory cells is delayed. In another aspect, the word line voltages of the interface memory cells is decreased to an intermediate level and held for a time period before being decreased further. In another aspect, the word line voltages of the interface memory cells are decreased at a lower rate.

20 Claims, 22 Drawing Sheets

(56) References Cited

U.S. PATENT DOCUMENTS

| | | |
|---|---|---|
| 2013/0242667 A1 | 9/2013 | Shim et al. |
| 2014/0247659 A1 | 9/2014 | Dong et al. |
| 2015/0085584 A1* | 3/2015 | Choi .................. G11C 16/26 365/185.21 |
| 2015/0235702 A1 | 8/2015 | Mun et al. |
| 2016/0148691 A1 | 5/2016 | Rabkin et al. |
| 2016/0232981 A1* | 8/2016 | Nam .................. G11C 16/0483 |
| 2018/0233206 A1* | 8/2018 | Yu .................. G11C 16/3431 |

OTHER PUBLICATIONS

U.S. Appl. No. 15/693,982, filed Sep. 1, 2017, by Diep et al.
U.S. Appl. No. 15/726,686, filed Oct. 6, 2017, by Yu et al.
International Search Report & The Written Opinion of the International Searching Authority dated Jan. 17, 2019, International Application No. PCT/US2018/052366.

* cited by examiner

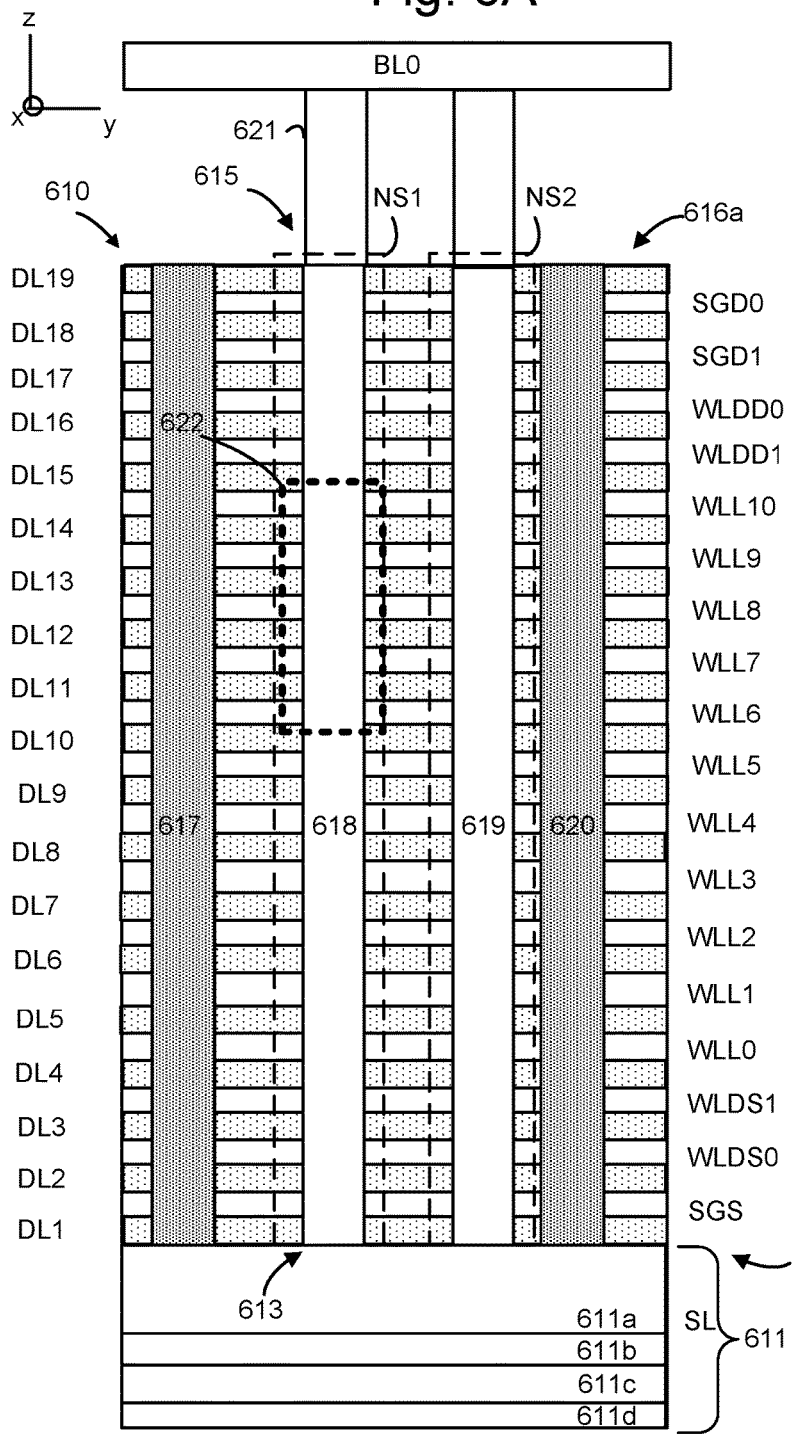
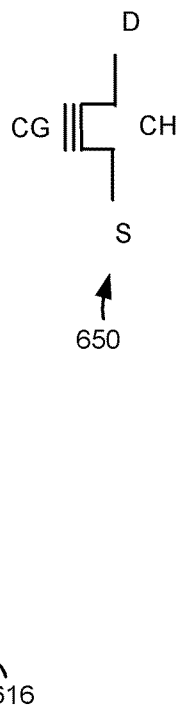
Fig. 6A
Fig. 6B

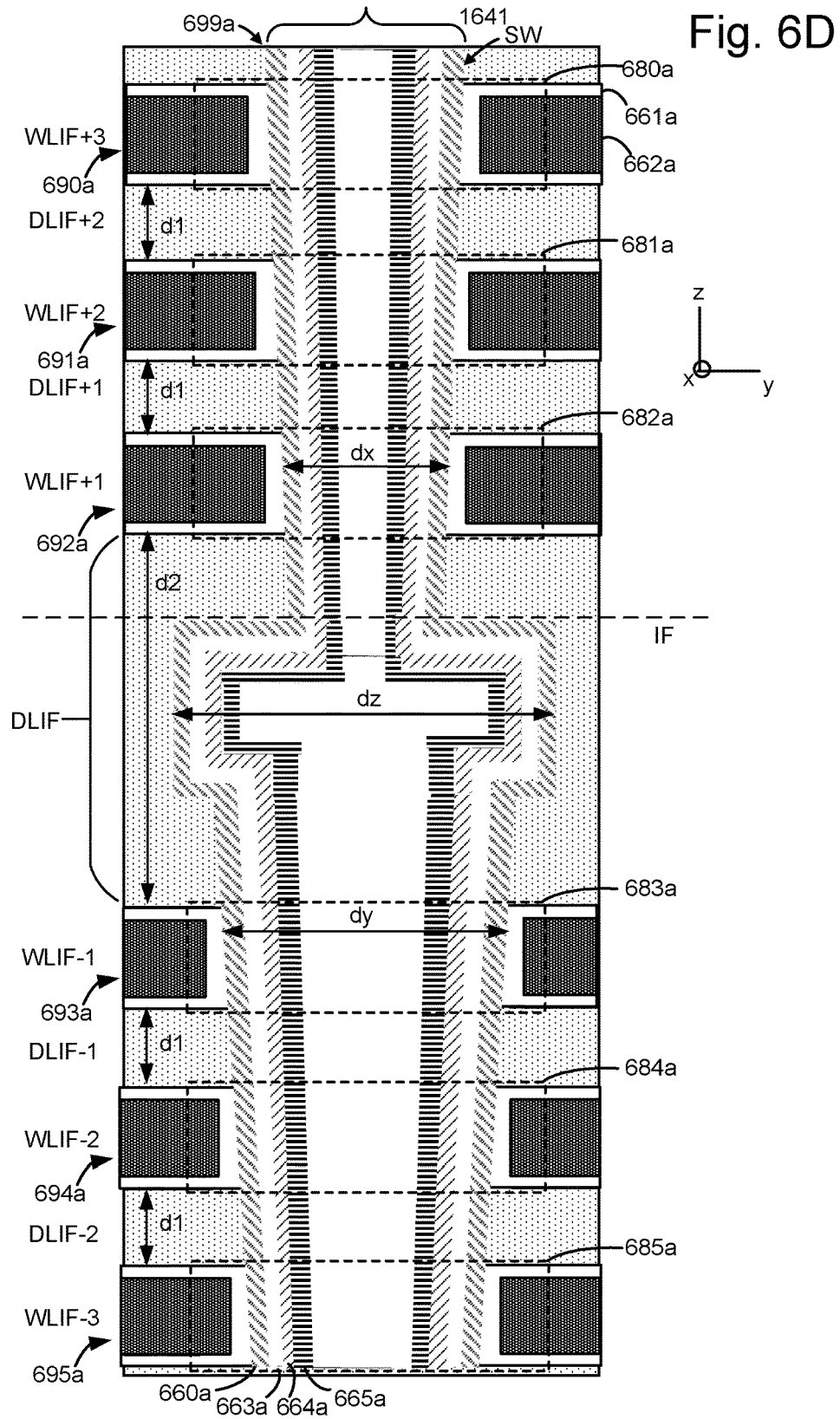

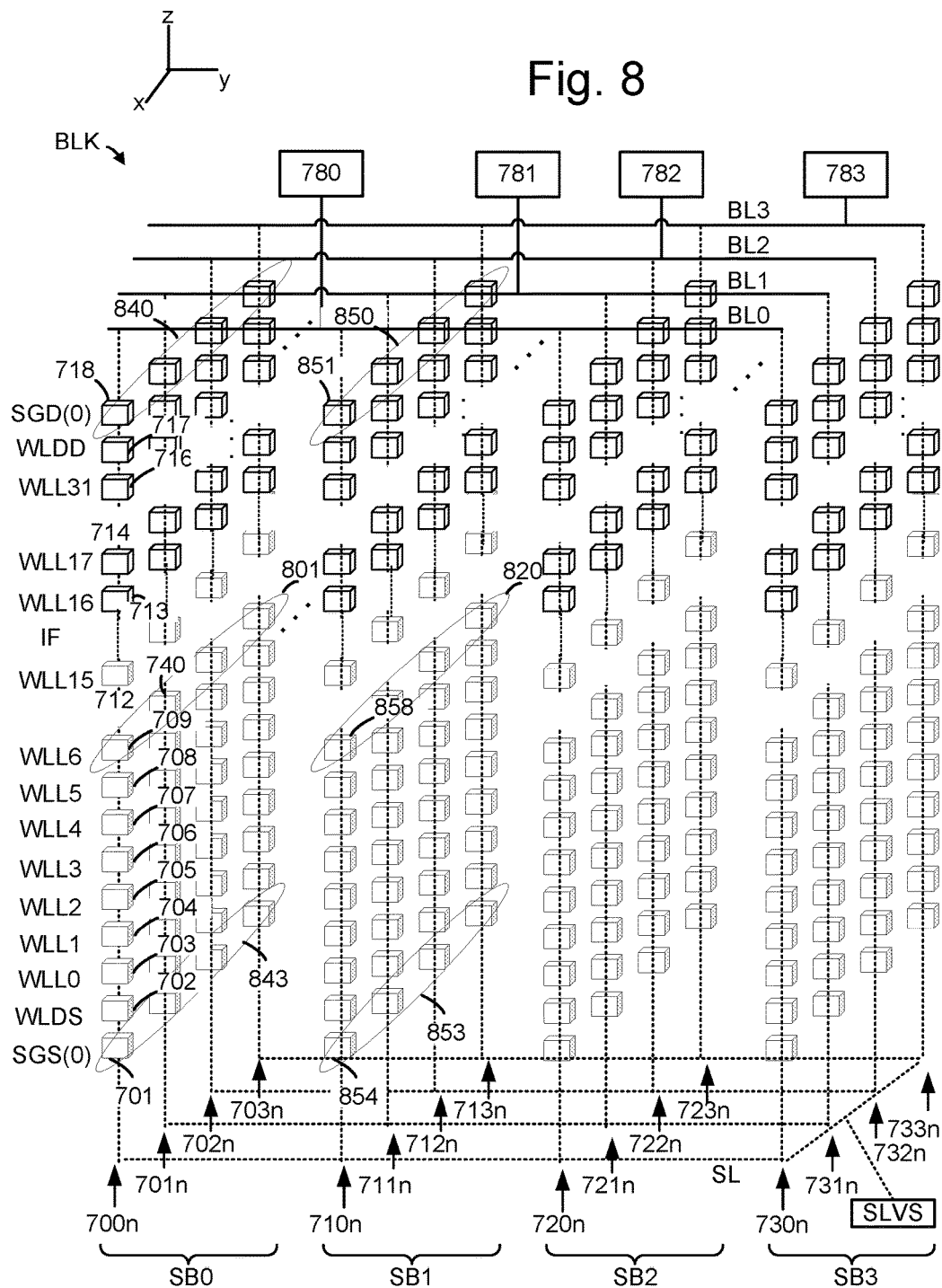

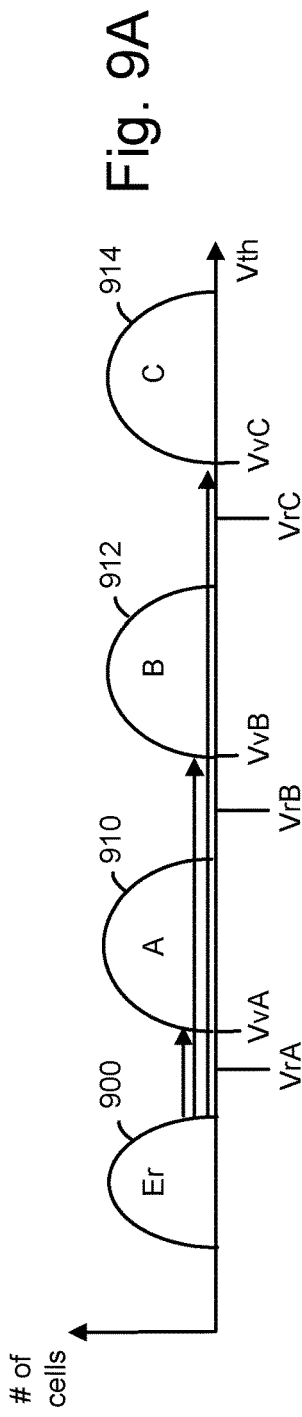
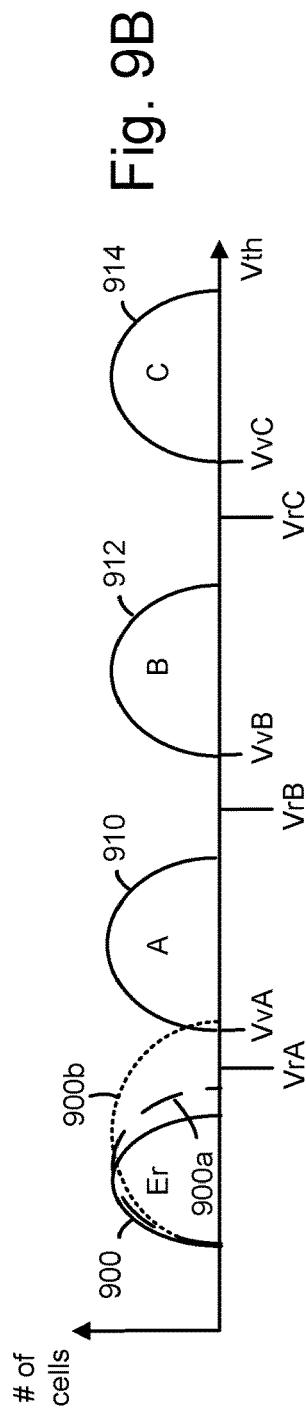
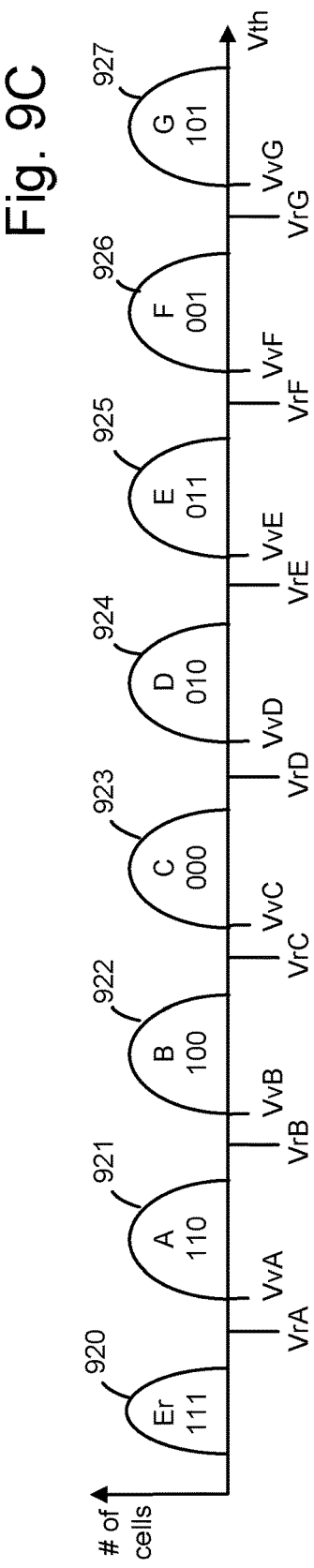

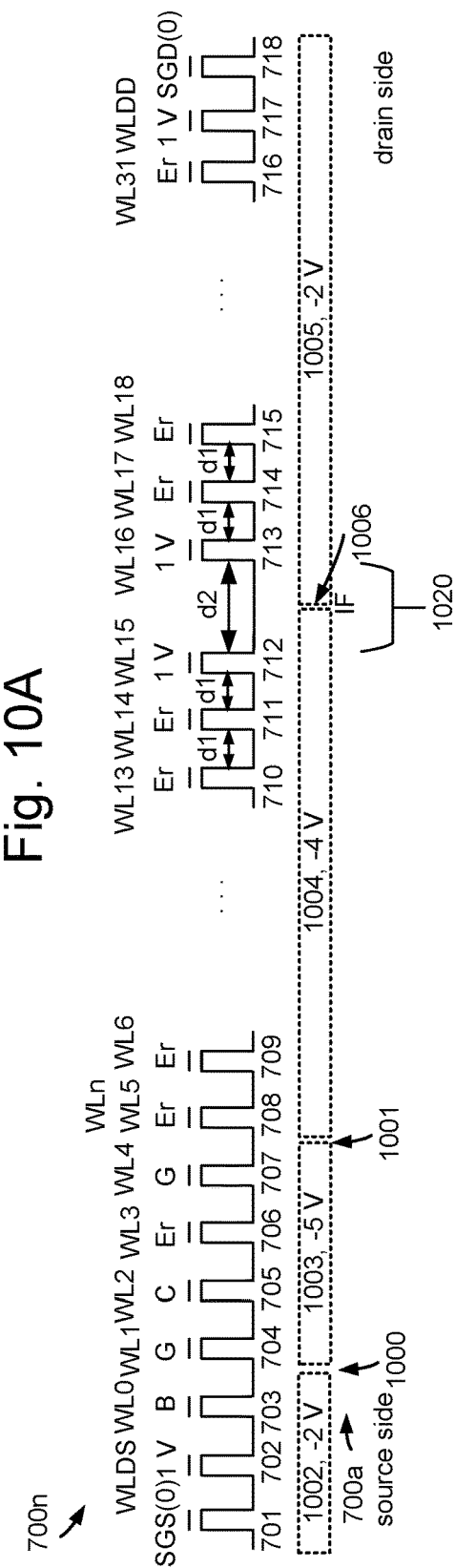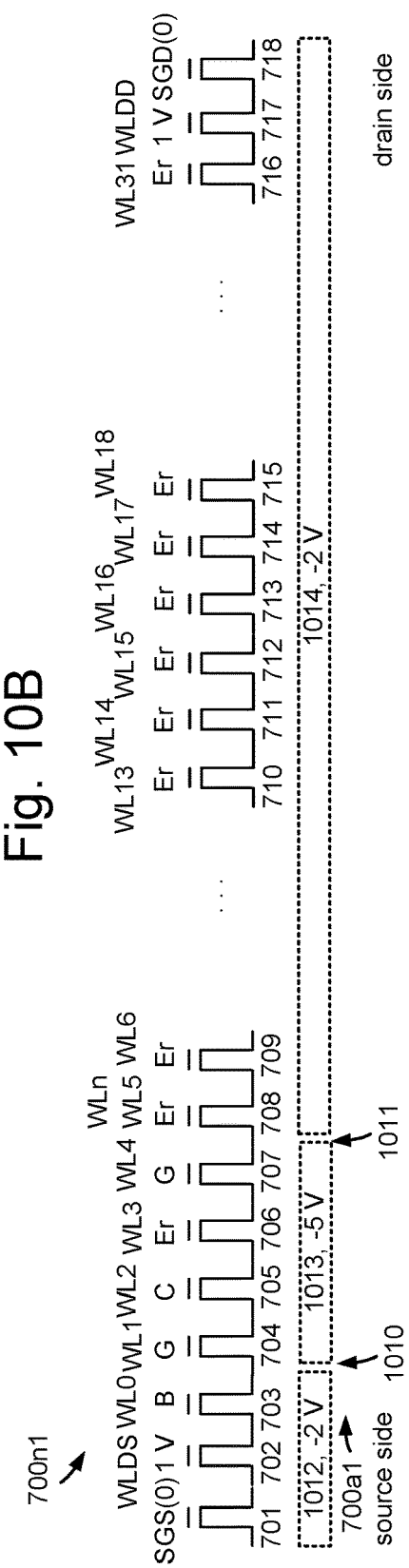

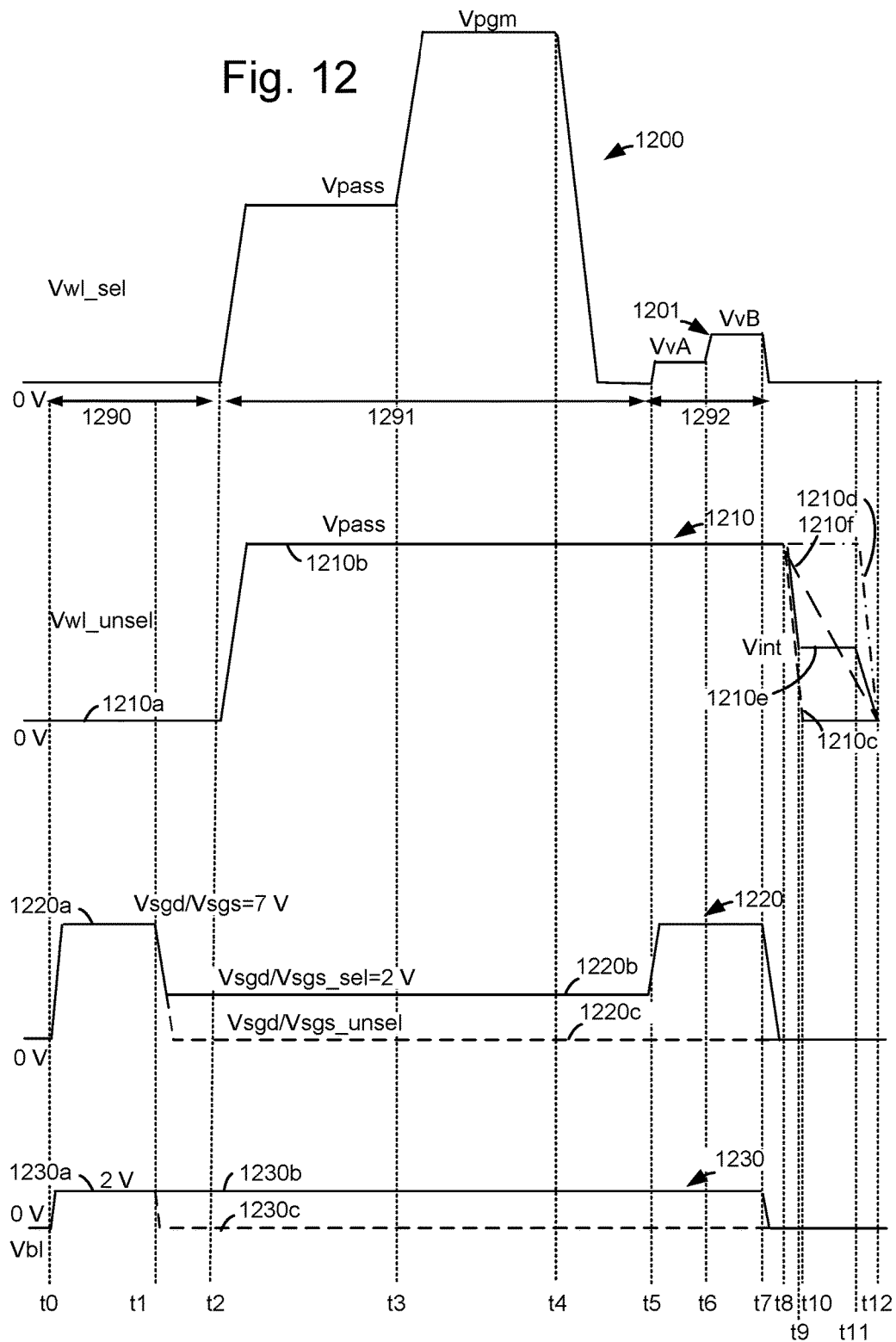

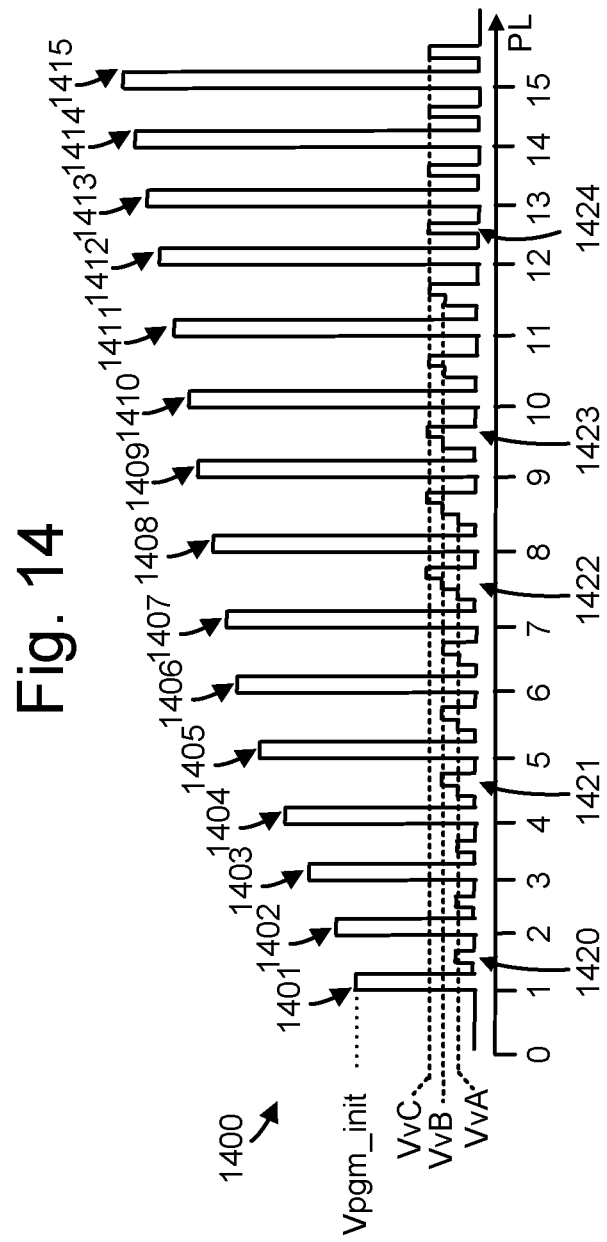

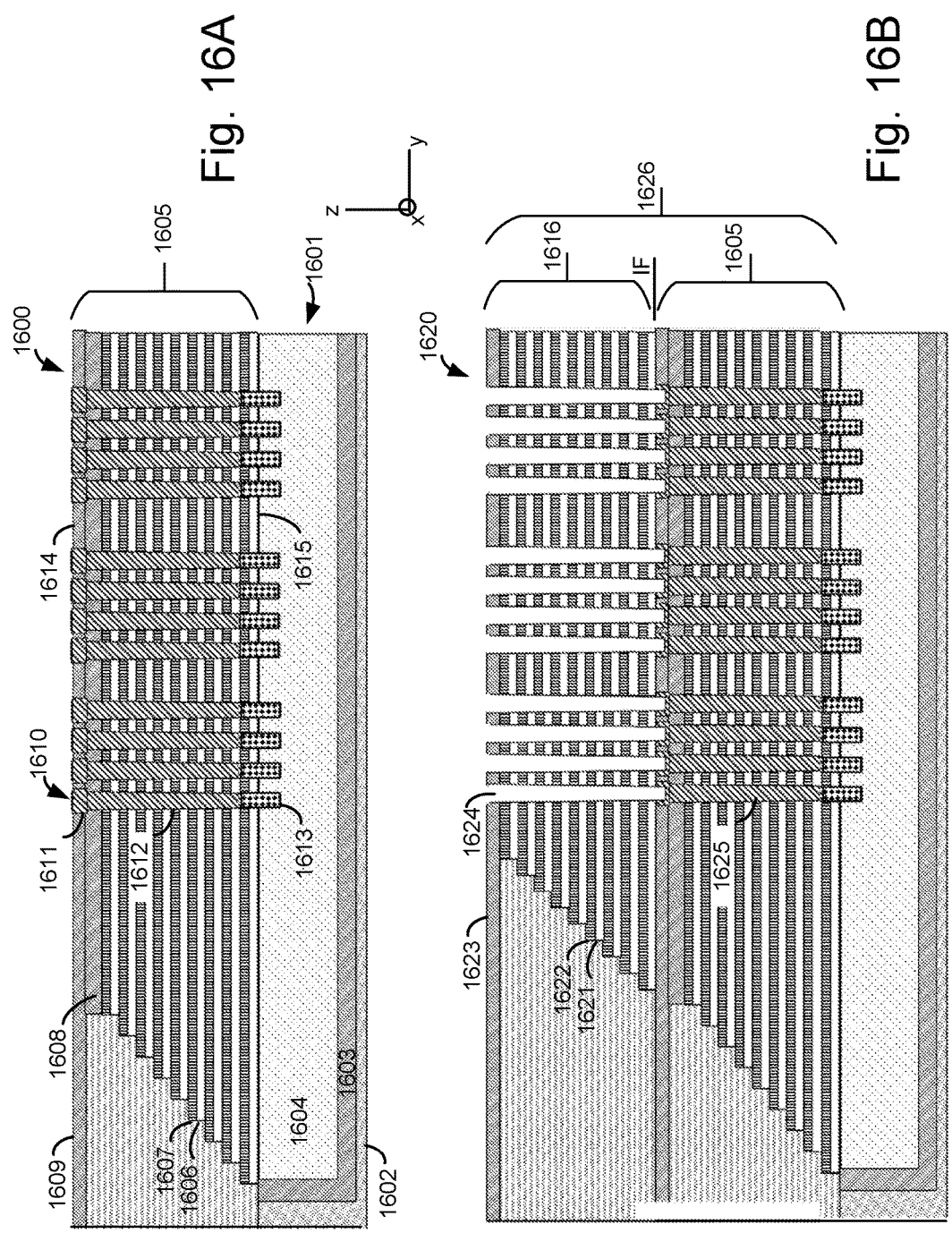

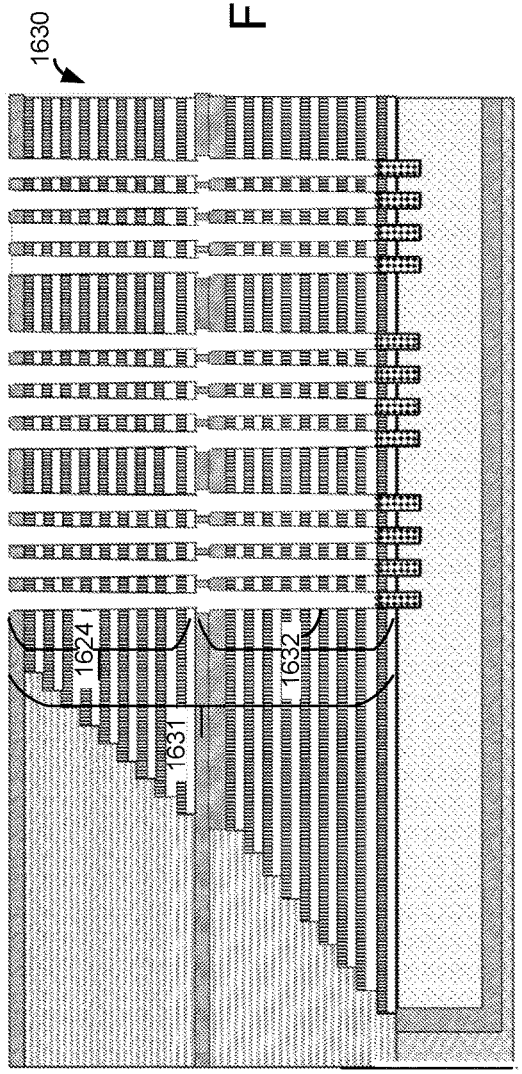 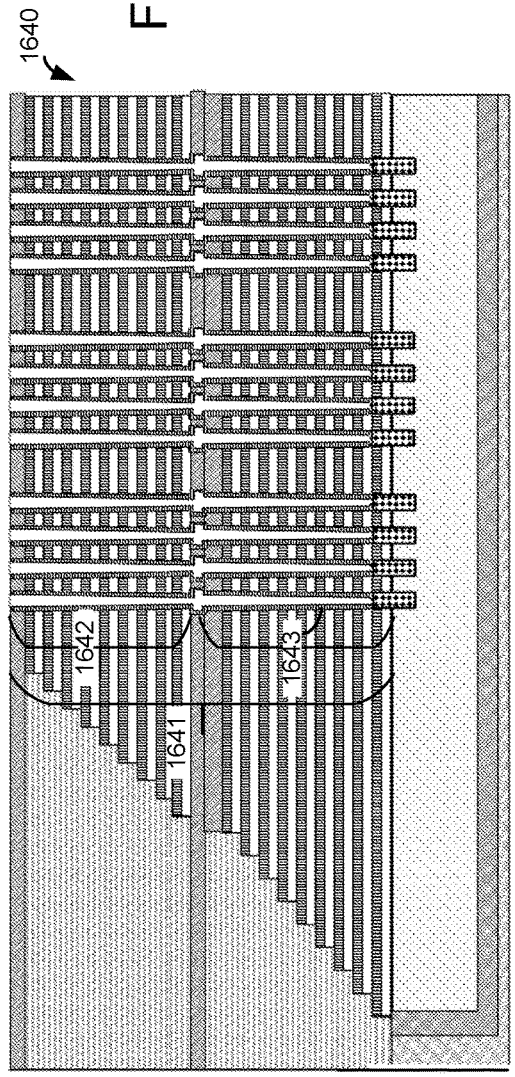

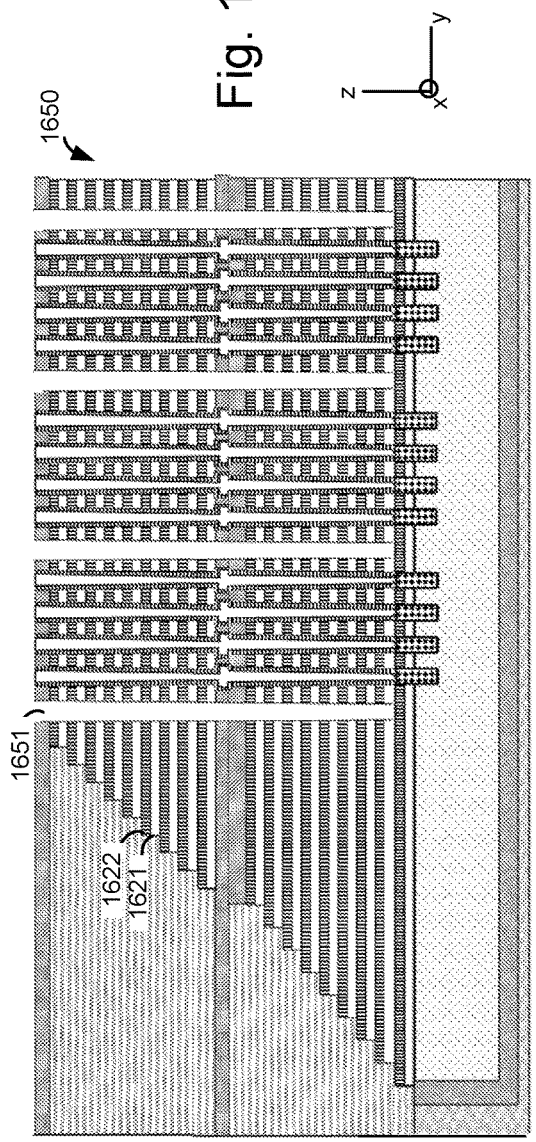
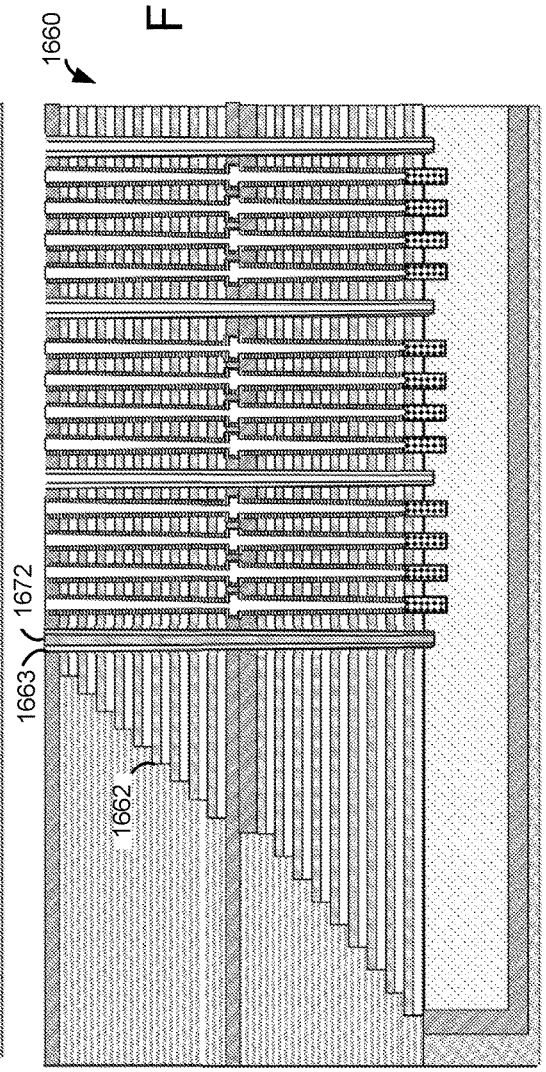

REDUCING PROGRAM DISTURB BY MODIFYING WORD LINE VOLTAGES AT INTERFACE IN TWO-TIER STACK AFTER PROGRAM-VERIFY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example transistor 650.

FIG. 6D depicts a close-up view of a region 623 of the stack of FIG. 16G, where an interface IF is formed between two tiers of the stack.

FIG. 8 depicts additional detail of the sub-blocks SB0-SB3 of FIG. 7.

FIG. 9A depicts an example threshold voltage (Vth) distribution of a set of memory cells connected to a selected word line after a programming operation, where four data states are used.

FIG. 9B depicts an example Vth distribution of the set of memory cells of FIG. 9A, showing the effects of program disturb.

FIG. 9C depicts an example Vth distribution of a set of memory cells connected to a selected word line after a programming operation, where eight data states are used.

FIG. 10A depicts voltages in channel regions of the NAND string 700n of FIG. 7, where the channel has an interface (IF) between tiers of a stack which is consistent with FIG. 16G.

FIG. 10B depicts voltages in channel regions of a NAND string 700n1 which corresponds to the NAND string 700n of FIG. 7, but where the channel does not have an interface between tiers of a stack.

FIG. 12 depicts plots of voltages which can be used in a program loop of a program operation, consistent with FIGS. 11A and 11B.

FIG. 14 depicts a series of program loops in an example programming operation, consistent with FIG. 11A.

FIG. 16A depicts a semiconductor structure in a configuration which is consistent with steps 1500 and 1501 of FIG. 15.

FIG. 16B depicts a semiconductor structure in a configuration which is consistent with steps 1502 and 1503 of FIG. 15.

FIG. 16C depicts a semiconductor structure in a configuration which is consistent with step 1504 of FIG. 15.

FIG. 16D depicts a semiconductor structure in a configuration which is consistent with step 1505 of FIG. 15.

FIG. 16E depicts a semiconductor structure in a configuration which is consistent with step 1506 of FIG. 15.

FIG. 16F depicts a semiconductor structure in a configuration which is consistent with steps 1507 and 1508 of FIG. 15.

DETAILED DESCRIPTION

Figure 1:
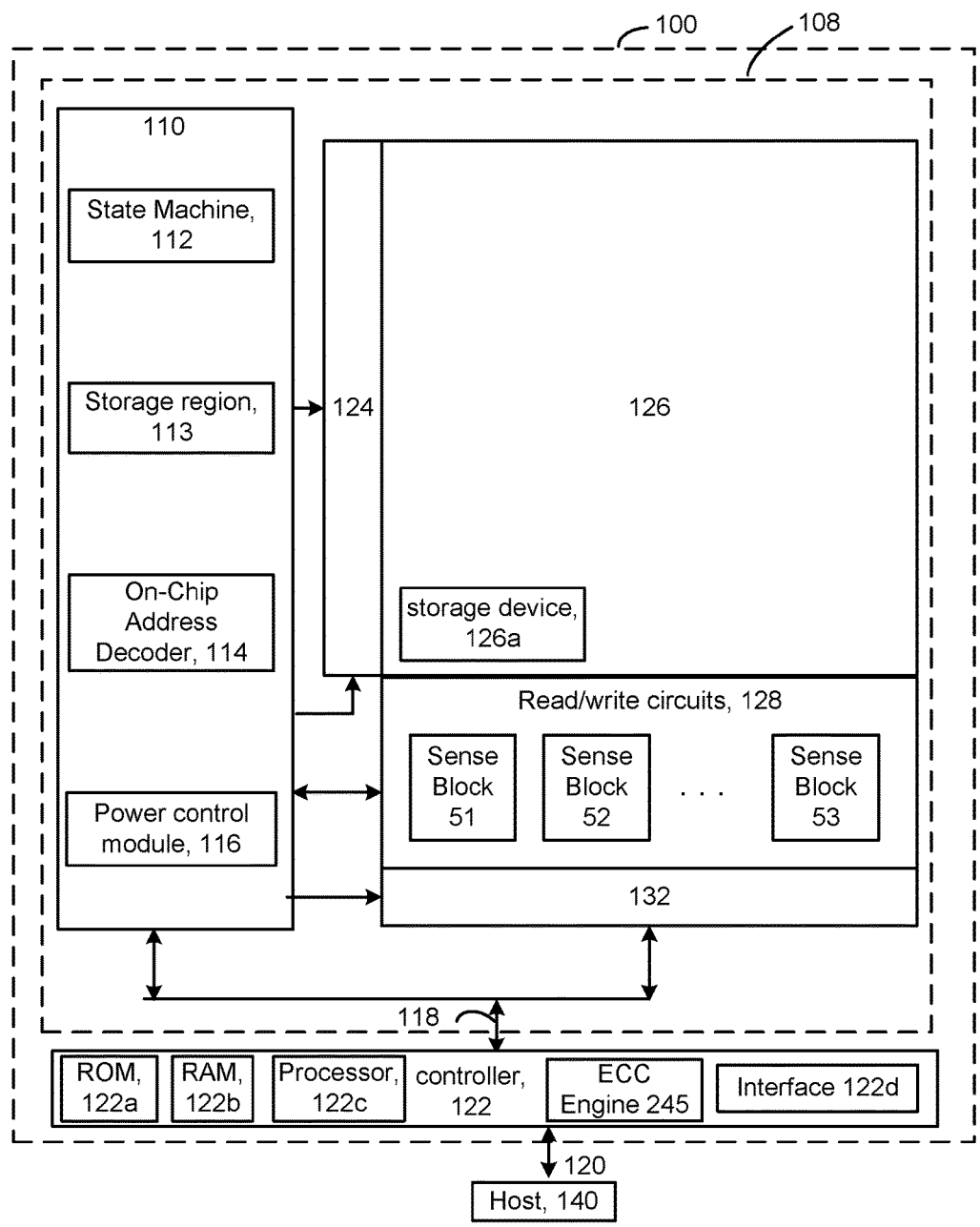
FIG. 1 is a block diagram of an example memory device.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate (SG) transistors (referred to as SGD transistors), on a drain-end of the NAND string which is connected to a bit line, and one or more source-end SG transistors (referred to as SGS transistors), on a source-end of the NAND string or other NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a NAND string of memory cells to provide a gradual transition in the channel voltage gradient. Data memory cells and dummy memory cells may have a same structure but the dummy memory cells are typically not used to store user data because they are at a transition point in a NAND string such as at the end of the NAND string.

Each memory cell may be associated with an assigned data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 9A). In a three-bit per cell memory device, there are eight data states including the erased state and seven higher data states referred to as the A, B, C, D, E, F and G data states (see FIG. 9C). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

During a programming operation, the memory cells may be programmed according to a word line programming order. The memory cells may also be programmed according to a sub-block programming order, where, for each word line, memory cells in one sub-block, or portion of a block, are programmed before programming memory cells in another sub-block. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. In each program loop, a program voltage is applied to the selected word line, and subsequently one or more verify tests may be performed to determine whether the memory cells have completed programming to their assigned data states.

A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops. After the verify test, the voltages of the unselected word lines are decreased from the read pass voltage (e.g., 8-10 V) to a steady state voltage Vss (e.g., 0 V).

However, it has been determined that program disturb can occur for some 3D memory structures in which the memory cells are arranged in vertical NAND strings (or other sets of connected memory cells) in a stack, where the stack comprises alternating conductive and dielectric layers. In this structure, the conductive layers act as word lines which are connected to the memory cells. Each NAND string may have the shape of a pillar which intersects with the word lines to form the memory cells. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. For example, see FIG. 16G where a stack 1626 comprises a top (second) tier 1616 formed on a bottom (first) tier 1605. The memory hole is etched separately in each tier so that a low aspect ratio can be achieved. However, the dielectric layer or region at the interface (IF) between the tiers is relatively thicker than the other dielectric layers. As a result, the distance between memory cells which are adjacent to the interface will be greater than the other inter-cell distances.

Because of this increased distance, the channel region at the interface will turn off (become non-conductive) more quickly than other channels regions of a NAND string when the unselected word line voltages are decreased after a verify test. This tends to trap residue electrons in the channel below the interface. During a subsequent program loop, this channel portion will experience reduced boosting so that program disturb is increased for the unselected memory cells.

Techniques provided herein address the above and other issues. In one aspect, the timing of the voltage (Vwl_unsel2) of the word lines or memory cells which are adjacent to the interface and are spaced apart from one another by a distance d2 (e.g., second word lines or memory cells) is different than the timing of the voltages (Vwl_unsel1) of the word lines or memory cells which are non-adjacent to the interface and are spaced apart from one another by a distance d1<d2 (e.g., first word lines or memory cells). For example, the start of the decrease of Vwl_unsel2 can be delayed relative to the start of the decrease of Vwl_unsel1. In another example, Vwl_unsel2 is decreased to an intermediate voltage Vint, held at Vint for a period of time, then decreased to Vss. In another example, a rate of decrease of Vwl_unsel2 is less than a rate of decrease of Vwl_unsel1. Variations include making the above adjustments based on the positions of the selected memory cell or the selected word line and/or based on the current program loop and the associated level of the program voltage.

These approaches provide the channel region at the interface in a conductive state for a relatively longer period of time to allow residue electrons to escape the channel so that channel boosting is improved in a subsequent program loop. Moreover, the implementation complexity and time penalty is minimized.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The power control module can include voltage sources such as discussed in connection with FIG. 4.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a NAND string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
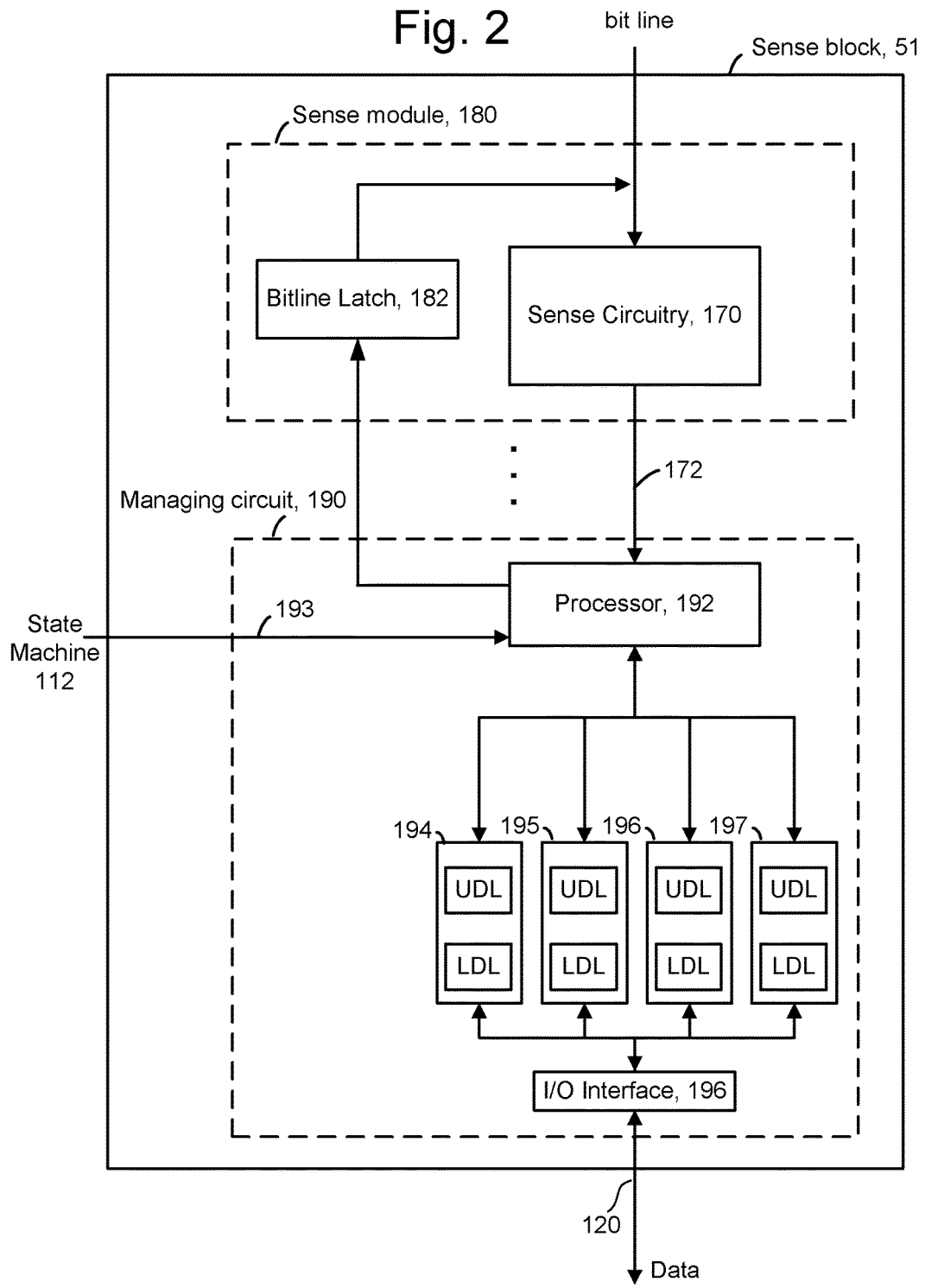
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify test) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
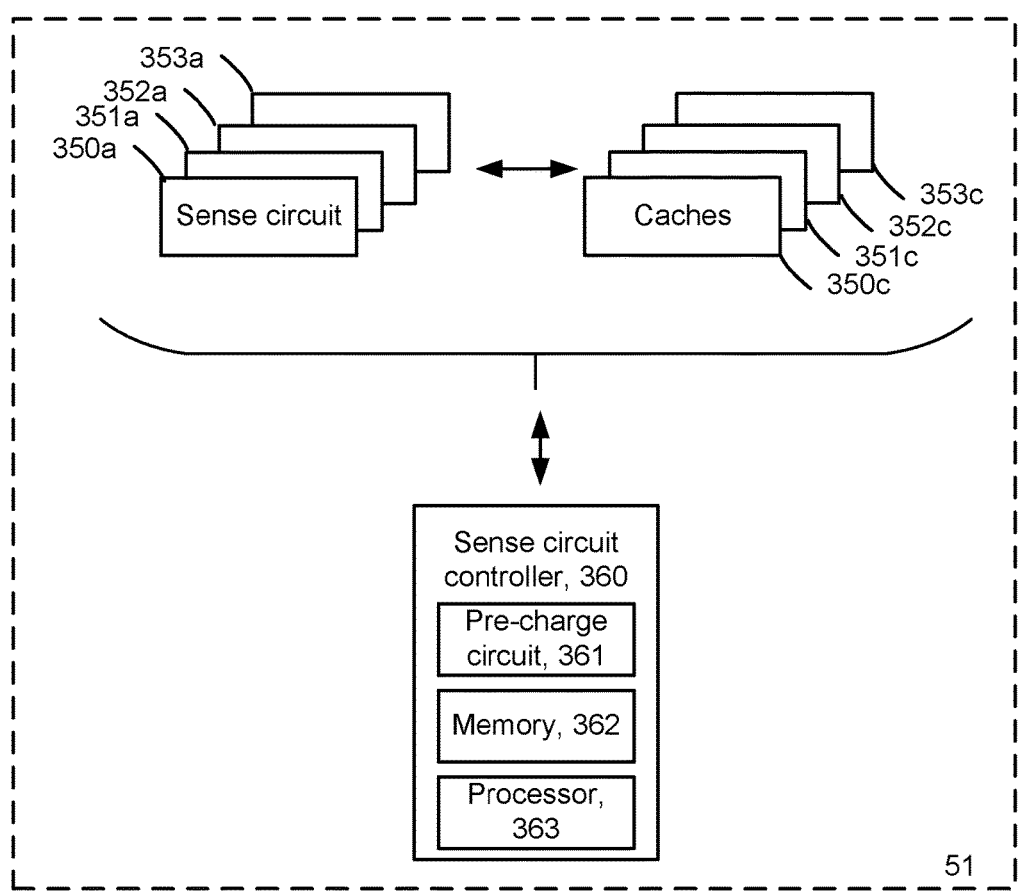
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
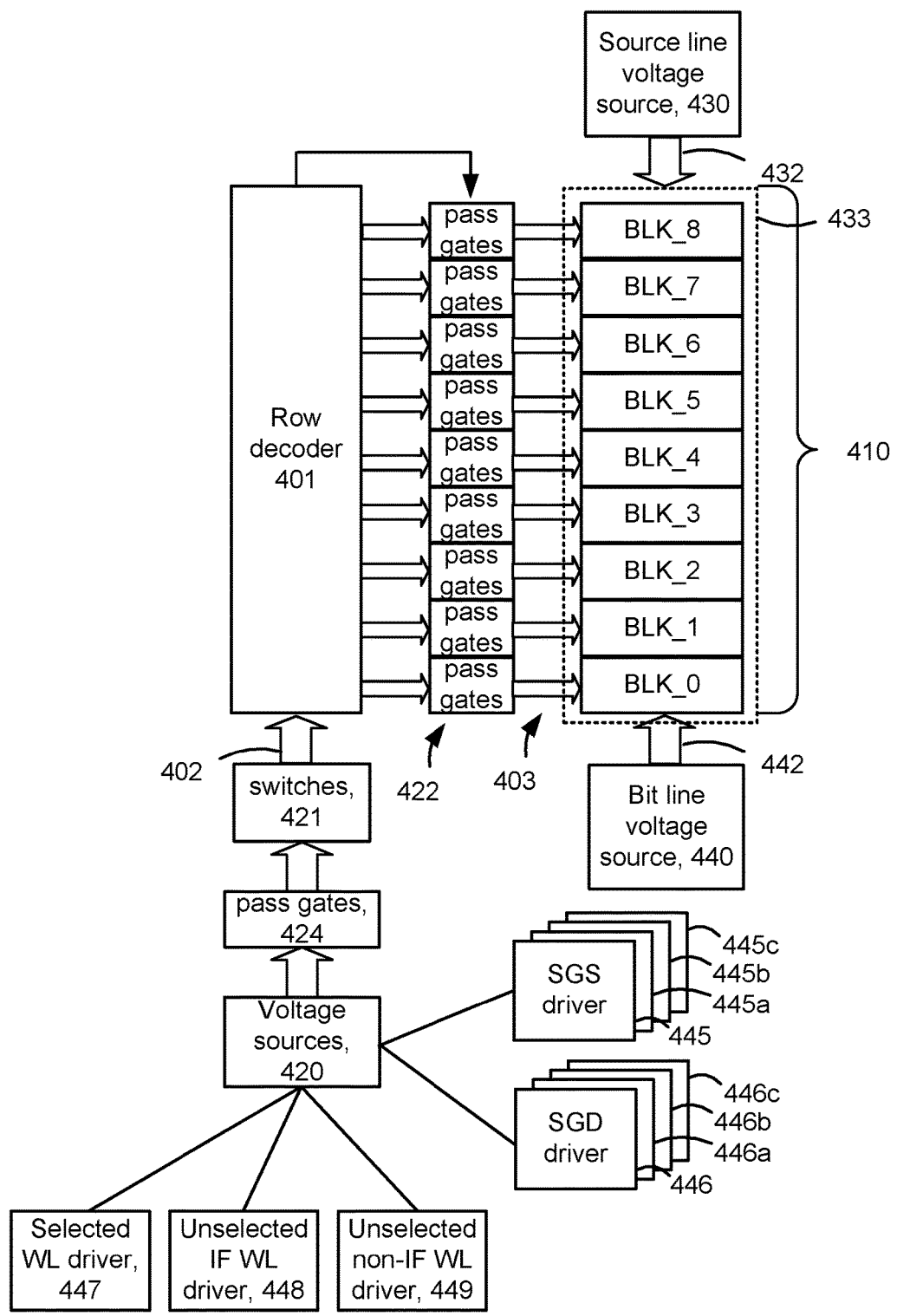
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_8. The row decoder provides a control signal to pass gates 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, an unselected interface (IF) word line driver 448, which provides a voltage on a word line which is adjacent to an interface in a stack and is not selected during a program or read operation, and an unselected non-interface (non-IF) word line driver 449, which provides a voltage on word lines which are not adjacent to the interface and are not selected during a program or read operation. The word line drivers 448 and 449 are examples of unselected word line drivers. When a word line is selected for a program or read operation, some or all of its associated memory cells are also selected.

The voltage sources can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. In another option, one SGS driver is common to the different sub-blocks in a block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
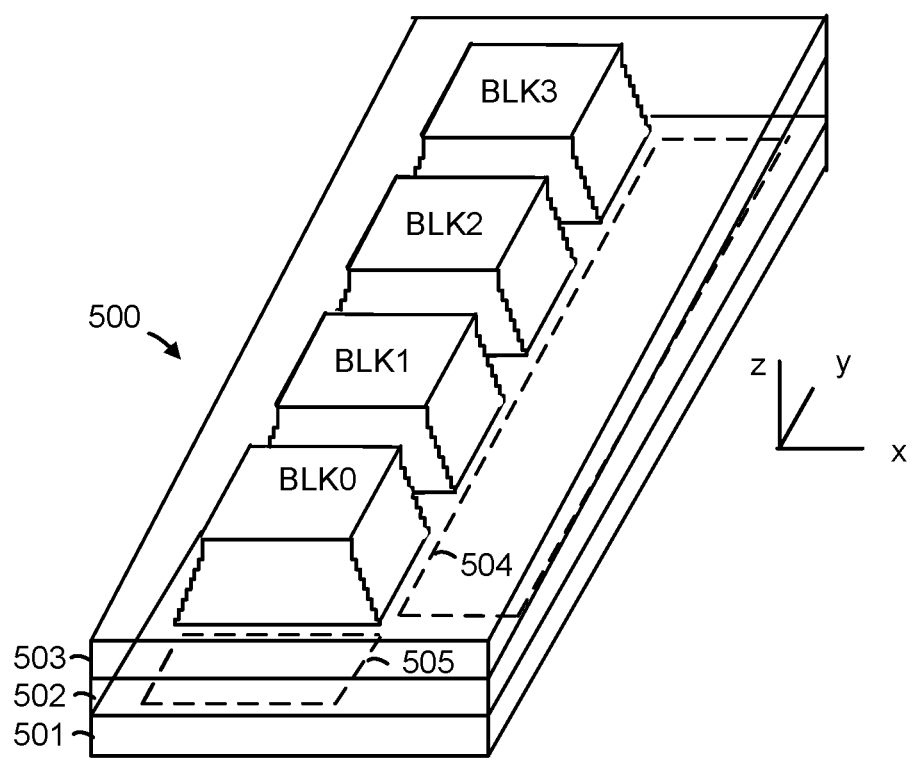
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage source of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
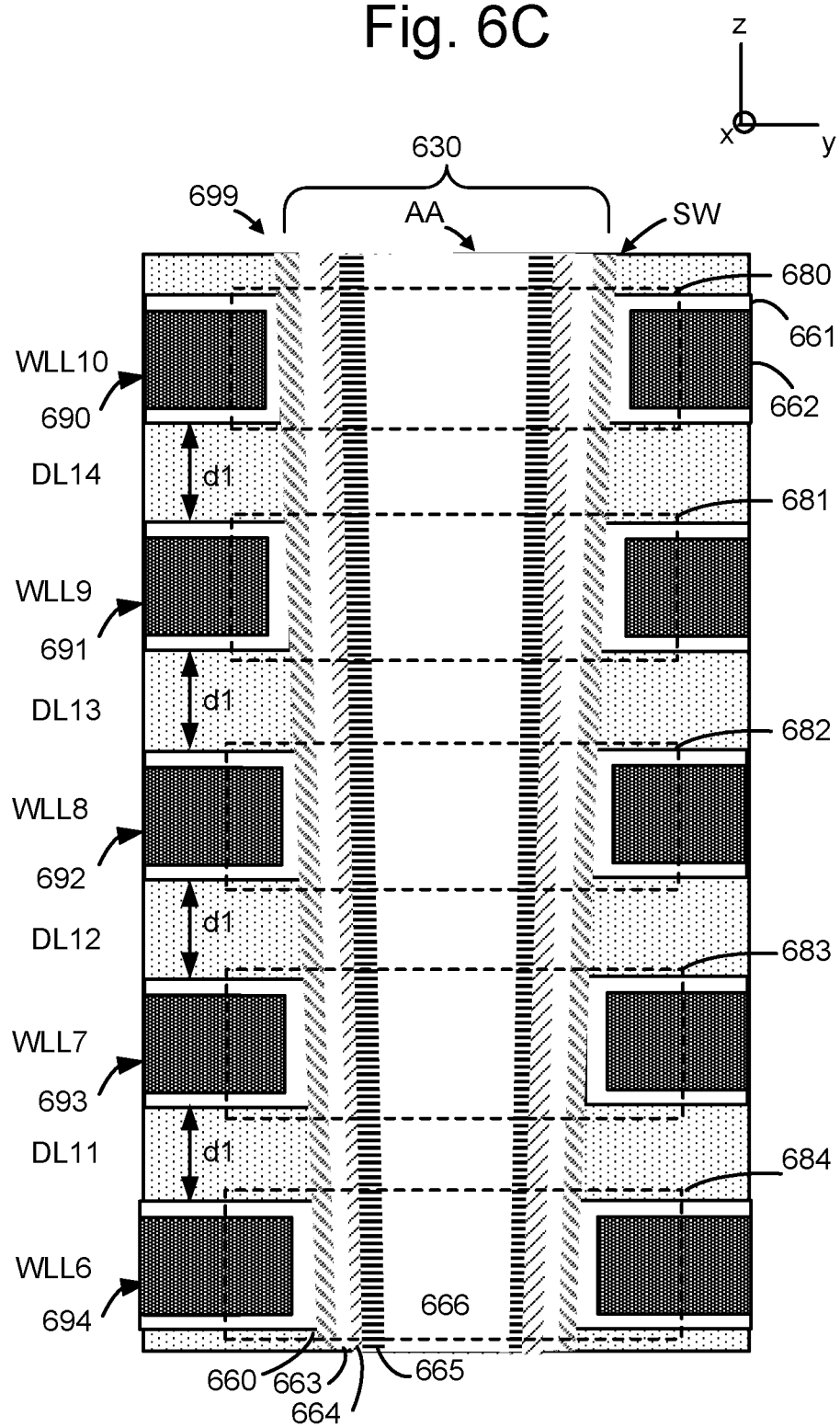
FIG. 6C depicts a close-up view of the region 622 of the stack of FIG. 6A, where the stack comprises a single tier.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

Other configurations are possible as well. For example, the NAND strings of FIG. 7 have 32 data memory cells, two edge dummy memory cells and one each of the SGD and SGS transistors.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate layers (e.g., conductive layers or regions) and dielectric layers or regions, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A, where the stack comprises a single tier. Memory cells are formed at the different levels of the stack at the intersection of a word line layer and a memory hole. The word line layers are connected to control gates of the memory cells. This example includes memory cells 680, 681, 682, 683 and 684 in WLL10, WLL9, WLL8, WLL7 and WLL6. The word line layers are spaced apart by dielectric layers DL14, DL13, DL12 and DL11A which each have a thickness of d1. This is also an inter-cell distance, or the distance between each pair of adjacent memory cells along the z or vertical axis.

A number of layers can be deposited along the sidewall (SW) of the memory hole 630 and/or within each word line layer, e.g., using atomic layer deposition. For example, each pillar 699 or column which is formed by the materials within a memory hole can include a blocking oxide/block high-k material 660, a charge-trapping layer 663 or film such as silicon nitride (Si3N4) or other nitride, a tunneling layer 664 and a channel 665 (e.g., comprising polysilicon). A dielectric core 666 fills a remainder of the memory hole. A word line layer can include a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a NAND string.

Each NAND string comprises a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 16G:
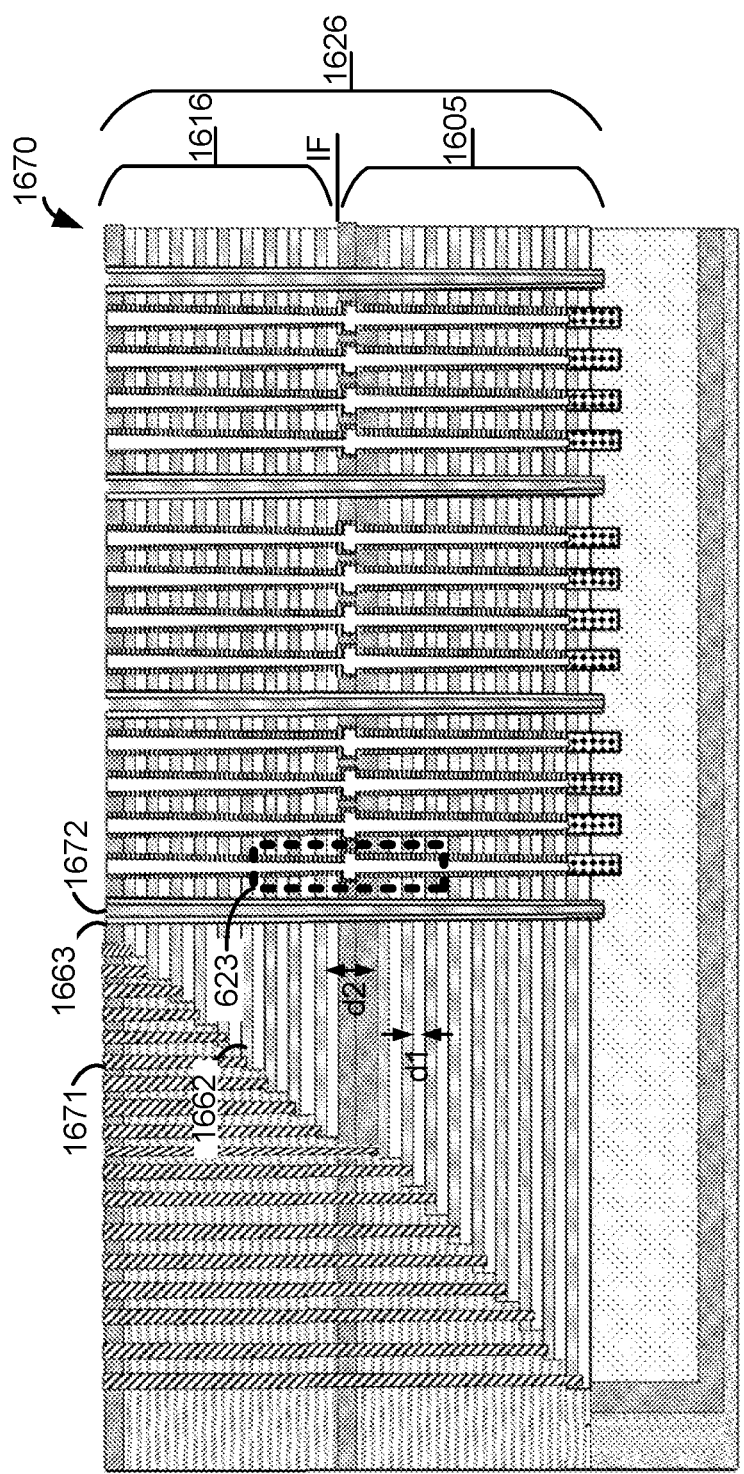
FIG. 16G depicts a semiconductor structure in a configuration which is consistent with steps 1509 and 1510 of FIG. 15.

FIG. 6D depicts a close-up view of a region 623 of the stack of FIG. 16G, where an interface IF is formed between two tiers of the stack. This example includes memory cells 680a, 681a, 682a, 683a, 684a and 685a in word line layers WLIF+3, WLIF+2, WLIF+1, WLIF−1, WLIF−2 and WLIF−3, respectively. The numbering of the word lines in this example is relative to the interface. The word line layers are spaced apart by dielectric layers DLIF+2, DLIF+1, DLIF−1 and DLIF−2, which each have a thickness of d1 (a first distance), and by DLIF, which has a larger thickness d2 (a second distance) or height which is the distance between the memory cells 682a and 683a. D1 and d2 are also inter-cell distances, or the distance between adjacent memory cells along the z or vertical axis. In one approach, d2 is at least twice the height of d1. D2 could be 2-5 times the height of d1, for instance.

DLIF can be an aggregated layer which is made up of dielectric materials which are deposited in one or more separate layers on top of one another. The memory cell 682a is adjacent to and above the interface and the memory cell 683a is adjacent to and below the interface. These are interface memory cells. The second distance spans the interface. In some cases, the memory cells 682a and 683a can be set as dummy memory cells which are ineligible to store user data, due to the difficulty in controlling the channel region along the distance d2. WLIF+1 and WLIF−1 are dummy word lines in this case.

The memory hole which is etched through each tier of the stack has a tapered shape, e.g., wider at the top and narrower at the bottom. As a result, the memory hole diameter dy at the top word line layer or memory cell in the bottom tier is larger than the memory hole diameter dx at the bottom word line layer or memory cell in the top tier. A diameter dz represents a widest region of the memory hole. This widened region is used to accommodate small misalignments in the memory hole portion of the top tier relative to the memory hole portion in the bottom tier. The increase thickness d2 of DLIF is provided due to process margin concerns and also accommodates misalignment by providing a transition region between the memory hole portions in the two tiers.

The column 1641 (FIG. 16D) or memory hole 1631 (FIG. 16C) comprises an interface at which a diameter of the memory hole widens, partway along a height of the memory hole.

As in FIG. 6C, a number of layers can be deposited along the sidewall of the memory hole. The layers can conform to the changing diameter in the interface. For example, each pillar 699a or column which is formed by the materials within a memory hole can include a blocking oxide/block high-k material 660a, a charge-trapping layer 663a or film, a tunneling layer 664a and a channel 665a. A dielectric core 666s fills a remainder of the memory hole. A word line layer can include a metal barrier 661a, and a conductive metal 662a as a control gate. For example, control gates 690a, 691a, 692a, 693a, 694a and 695a are provided.

Figure 7:
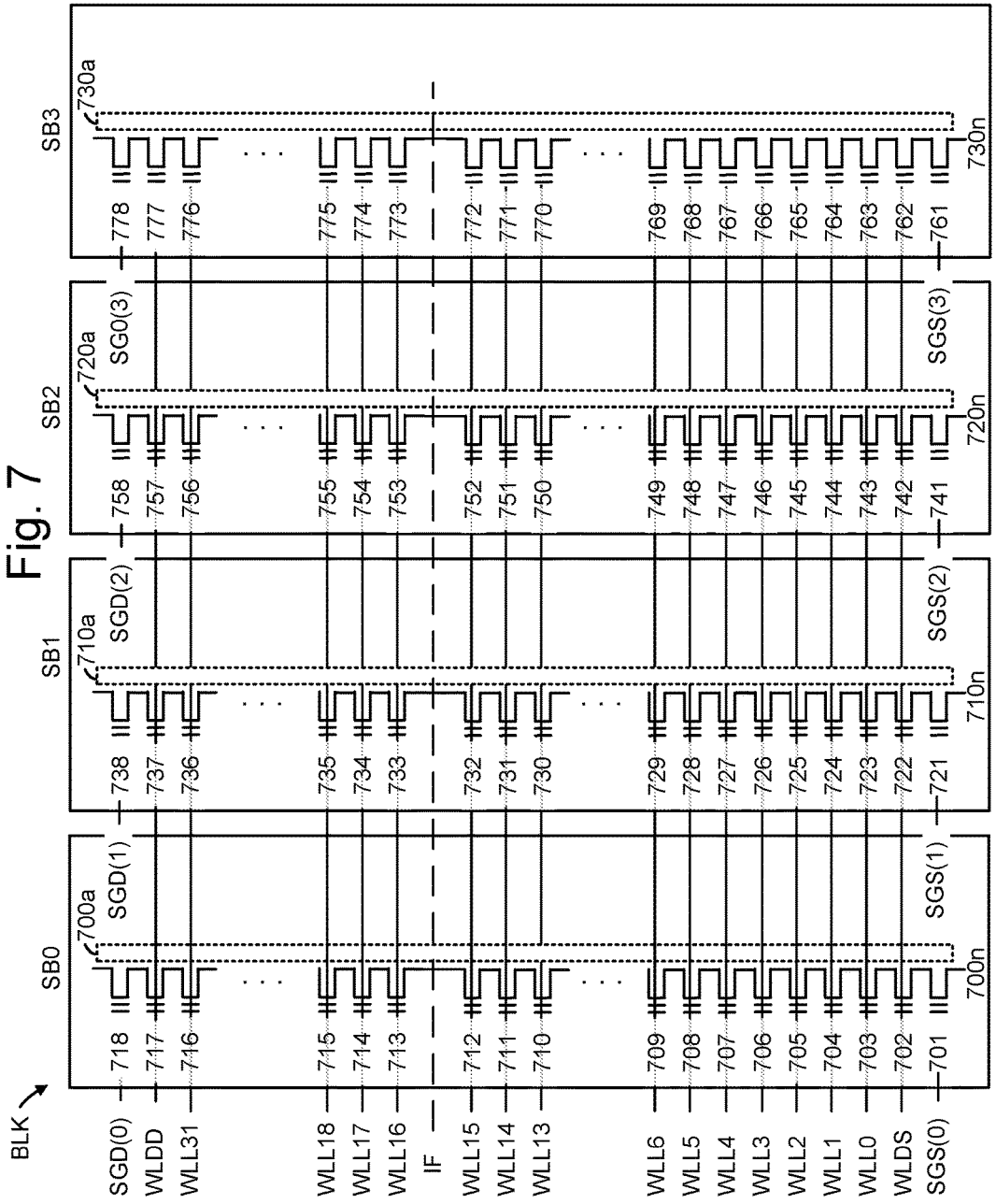
FIG. 7 depicts an example view of NAND strings in sub-blocks in a 3D configuration which is consistent with the two-tier stack of FIG. 16G.

FIG. 7 depicts an example view of NAND strings in sub-blocks in a 3D configuration which is consistent with the two-tier stack of FIG. 16G. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, thirty-two data memory cells (where sixteen are above the interface IF and sixteen are below the interface), one source-side dummy memory cell and one SGS transistor.

In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end word line and proceeding one word line at a time to WLL31, the drain-end word line.

The NAND strings 700n, 710n, 720n and 730n have channels 700a, 710a, 720a and 730a, respectively.

Additionally, NAND string 700n includes SGS transistor 701, dummy memory cells 702 and 717, data memory cells 703-716, and SGD transistor 718.

NAND string 710n includes SGS transistor 721, dummy memory cells 722 and 737, data memory cells 723-736, and SGD transistor 738.

NAND string 720n includes SGS transistor 741, dummy memory cells 742 and 757, data memory cells 743-756, and SGD transistor 758.

NAND string 730n includes SGS transistor 761, dummy memory cells 762 and 777, data memory cells 763-776, and SGD transistor 778.

The SGD transistors in SB0, SB1, SB2 and SB3 may be driven by separate control lines SGD(0) and SGD(1), SGD(2) and SGD(3), respectively. The SGS transistors in SB0, SB1, SB2 and SB3 may be driven by control lines SGS(0), SGS(1), SGS(2) and SGS(3), respectively.

In this example, the memory cells 713, 733, 753 and 773 are adjacent to and above the interface, and the memory cells 712, 732, 752 and 772 are adjacent to and below the interface.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, a set of memory cells 801, which includes example memory cells 709 and 740 in NAND strings 700n and 701n, respectively, is connected to WLL6 in SB0.

WLL31 is the drain-end or drain-edge data word line and WLL0 is the source-end or source-edge data word line. A set of memory cells may be programmed or read concurrently. An additional set of memory cells is connected to WLL6 in each of the other sub-blocks SB1-SB3. For example, a set of memory cells 820, which includes an example memory cell 858 in NAND string 710n, is connected to WLL6 in SB1.

When the selected memory cells of WLL6 in SB0 are programmed (e.g., memory cell 709), the unselected memory cells of WLL6 in SB0 (e.g., memory cell 740), and the unselected memory cells of WLL6 in SB1-SB3 (e.g., memory cell 858 in SB1) are most susceptible to program disturb. The memory cells being programmed in a current program loop are the selected memory cells, the associated word line is a selected word line or word line layer and the associated sub-block is a selected sub-block. The word lines other than WLL6 are the unselected word lines or word line layers. The notations WLn, WLn-1 and WLn+1 may be used to represent a selected word line, an adjacent source-side unselected word line, and an adjacent drain-side unselected word line, respectively.

In this example, the source line SL or source region is driven at a voltage Vsl by a voltage source, SLVS.

Each NAND string includes one or more SGD transistors at the drain-end and one or more SGS transistors at the source end. In this case, there is one SGD transistor and one SGS transistor per string. Each SGD transistor may be connected to separate control line layer in each sub-block, as in FIG. 7, so that it can be driven separately, or the two or more SGD transistors in a NAND string, when present, may have their control gates connected and commonly driven in a sub-block. For example, SB0 has a set of SGD transistors 840, with an example SGD transistor 718 in the NAND string 700n. SB0 also has a set of SGS transistors 843, with an example SGS transistor 701 in the NAND string 700n. Similarly, SB1 has a set of SGD transistors 850, with an example SGD transistor 851 in the NAND string 710n. SB1 also has a set of SGS transistors 853, with an example SGS transistor 854 in the NAND string 710n.

FIG. 9A depicts an example threshold voltage (Vth) distribution of a set of memory cells connected to a selected word line after a programming operation, where four data states are used. A Vth distribution 900 is provided for erased (Er) state memory cells. Three Vth distributions 910, 912 and 914 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 8-10 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

FIG. 9B depicts an example Vth distribution of the set of memory cells of FIG. 9A, showing the effects of program disturb. Program disturb involves inadvertent programming of unselected memory cells connected to a selected word line due to insufficient boosting of the channels of the NAND strings of the unselected memory cells. The disturb results in a Vth upshift for a memory cell and is strongest for erased state memory cells. The disturb is proportional to the magnitude of Vpgm so that it is strongest in the later program loops in a sequence of program loops, when incremental step pulse programming is used. See FIG. 14, where Vpgm increases in each successive program loop.

The program disturb is caused by weak channel boosting during a program pulse. In particular, after a verify test in a program loop, the pass voltage on the unselected word lines ramps down to Vss. Since the channel region 1020 (see FIG. 10A) at the interface needs a relatively high fringing electric field to turn on, this channel region gets cut off relatively early when the pass voltages are ramping down. As a result, a relatively large number of electrons (channel residual electrons) stay in the channel region below the interface and cause the channel potential to be more negative at the end of a program loop.

At the beginning of the next program loop, a channel pre-charge operation is used to remove the channel residual electrons. Since the channel region at the interface is relatively difficult to turn on (make conductive), a relatively high bias is needed on the word lines adjacent to the interface (e.g., WL15 and WL16) to allow the residual electrons to move out of the channel. If the bias on these word lines is not sufficiently high, many channel residual electrons will remain and lower the boosting potential.

Finally, when the program pulse is applied, the memory cells in the NAND strings with the channels having the low boosting potential are more subject to program disturb.

Note that the problem of program disturb mentioned above can occur generally when two memory cells are spaced apart from one another by a relatively large distance, compared to the spacing of other memory cells in the NAND string. This is a problem even if the relatively larger distance does not span an interface between tiers in a stack. The problem can occur even in a single tier stack. The program disturb countermeasures described herein also apply to these situations and are not limited to the situation where the relatively larger distance spans an interface between tiers in a stack.

The plot 900a represent the erased state Vth with a relatively small amount of program disturb, and the plot 900b represent the erased state Vth with a relatively large amount of program disturb. Tests have shown that the amount of program disturb is significantly greater for the lower tier word lines, e.g., for the memory cells below the interface of a multi-tier stack, than for the memory cells above the interface, in the absence of the countermeasures described herein. This is due to the early cutoff of the channel region in the interface and the resulting trapping of electrons in the channel in the lower tier after a verify test, as mentioned. Further, in the lower tier, the program disturb is relatively larger when the selected memory cell is relatively closer to the source end of the NAND string, e.g., relatively closer to the bottom of the stack. This is due to the relatively longer distance which the electrons must travel to exit the channel at the drain end in the pre-charge phase of a program loop. The techniques provided herein can reduce the amount of program disturb by improving boosting of the channel. The techniques can be extended to a stack with more than two tiers as well.

FIG. 9C depicts an example Vth distribution of a set of memory cells connected to a selected word line after a programming operation, where eight data states are used. Single-pass or multi-pass programming may be used to obtain this Vth distribution. Based on the write data as indicated, the memory cells which are to remain in the Er state are represented by the Vth distribution 920. The memory cells which are to be programmed to the A, B, C, D, E, F and G states using verify voltages of VvA, VvB, VvC, VvD, VvE, VvF and VvG, respectively, are represented by the Vth distributions 921, 922, 923, 924, 925, 926 and 927, respectively. Each data state represents three bits of data as indicated. Read voltages VrA, VrB, VrC, VrD, VrE, VrF and VrG can be used for reading the states of the memory cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 10A depicts voltages in channel regions of the NAND string 700n of FIG. 7, where the channel has an interface (IF) between tiers of a stack which is consistent with FIG. 16G. In FIGS. 10A and 10B, the horizontal direction is a direction along the length of the channel of a NAND string. This may also be the vertical direction in a 3D memory structure. The channel 700a of FIG. 7 is repeated in FIG. 10A while a comparative channel 700a1 is provided for a comparative NAND string 700n1 in FIG. 10B.

The SGS transistor, SGD transistor, word line layers and memory cells of FIG. 7 are depicted. Additionally, data states are depicted for some of the memory cells. In this example, the NAND string or block has been partly programmed, from WL0 through WL4, and WL5 is the selected word line (WLn) where programming has just started. The programming of the memory cells is random, and the memory cells 703, 704, 705, 706 and 707 of the programmed word lines are, e.g., in the B, G, C, Er and G states, respectively. Eight data states are used as in FIG. 9C. The memory cells connected to WLn and to the word lines above WLn, e.g., on the drain side of WLn will be in the erased state at this point. This includes the memory cells 708-716.

FIG. 10A shows that, after a verify test in a program loop, when the voltages of the unselected word lines Vwl_unsel, a voltage of unselected word lines, decrease from a pass voltage, e.g., a read pass voltage, to Vss, the channel will be a cutoff between WLn and SGS(0). The channel will be cutoff first for the memory cells with the highest Vth, e.g., the G state cells. For example, consider the G state cell 707 which is closest to WLn on the source side of WLn, and the G state cell 704 which is closest to SGS(0). These cells become non-conductive, forming non-conductive junctions 1001 and 1000, respectively, in the channel 700a. Additionally, the channel portion 1020 at the interface (IF) will be cutoff as Vwl_unsel decreases, forming a channel junction 1006. Multiple channel regions are thus formed in which the voltage can float in each region. These include channel regions 1002, 1003, 1004 and 1005. When Vsgs, the voltage on SGS(0), reaches Vss, the voltage in the channel region 1002 is based on Vss minus the Vth of the SGS transistor 701. Assuming Vth=2 V, the voltage of the channel region 1002 is 0–2=–2 V. The channel voltage is capacitively coupled lower by the amount of the decrease in Vsgs below the Vth. A 1:1 coupling ratio is assumed for simplicity.

Similarly, the voltage in the channel region 1003 is based on Vss minus the Vth of the G state cells 704 and 707. Assuming Vth=5 V, the voltage of the channel region 1003 is 0–5=–5 V. The channel region 1020 adjacent to the interface will cutoff when Vwl_sel, a voltage of the selected word line, decreases below a Vth which is higher than the Vth of the memory cells 712 and 713. Assume Vth=0 V for the memory cells in the erased state. In this example, the memory cells 712 and 713 are dummy memory cells with Vth=1 V. The dummy memory cells 702 and 717 also have Vth=1 V. The reason for the early cutoff is that the fringing electric field of the control gates of the memory cells becomes unable to keep the channel region adjacent to the interface in a conductive state relatively quickly as Vwl_unsel decreases. As an example, the channel region 1020 may become non-conductive when the voltage on WL15 and WL16 falls below 4 V. The voltage in the channel region 1004 is therefore 0–4=–4 V.

At the drain end of the NAND string, when Vsgd, the voltage on SGD(0), reaches Vss, the voltage in the channel region 1005 is based on Vss minus the Vth of the SGD transistor 718. Assuming Vth=2 V, the voltage of the channel region 1005 is 0–2=–2 V.

Recall that the memory cells connected to WLn are most susceptible to program disturb. Accordingly, the voltage of –4 V in the channel region 1004, adjacent to WLn, is most relevant to program disturb. This voltage is relatively low and indicates the presence of a relatively large number of residue electrons. Generally, there will be relatively more electrons adjacent to the memory cells in the relatively low states such as the erased state. As mentioned, these residue electrons impair channel boosting in the program phase of subsequent program loop. This channel boosting is based on capacitive coupling from an increase in the word line voltages from Vss to a pass voltage. See FIG. 12 at t2. If the initial voltage is relatively low, as it is here, the final, peak boosted level will also be relatively low. The techniques provided herein increase the initial voltage so that the peak boosted level will be higher. A higher boosted channel level results in reduced program disturb because the gate-to-channel voltage is lower.

FIG. 10B depicts voltages in channel regions of a NAND string 700n1 which corresponds to the NAND string 700n of FIG. 7, but where the channel does not have an interface between tiers of a stack. The techniques provided herein help remove the negative effects of the interface and the increased distance d2 between the memory cells 712 and 713 which lead to an early channel cutoff and an increase in trapping of electrons below the interface. The result is a performance which is similar to a NAND string in which all of the memory cells are separated by the smaller distance d1.

During the decrease of Vwl_unsel from a pass voltage to Vss, the channel will be cutoff at the junctions 1010 and 1011, similar to the cutoff at the junctions 1000 and 1001, respectively in FIG. 10A. The channel regions 1012 and 1013 will have a voltage of –2 V and –5 V, respectively.

However, the additional junction 1006 is avoided so that a continuous voltage region 1014 of the channel which extends from WLn to SGD is provided. The voltage of this region becomes –2 V based on the Vth of the SGD transistor 718. This voltage is significantly higher than the –4 V seen in FIG. 10A. As a result, the peak channel boosting in the next program loop is significantly increased and program disturb is significantly decreased accordingly.

Figure 11A:
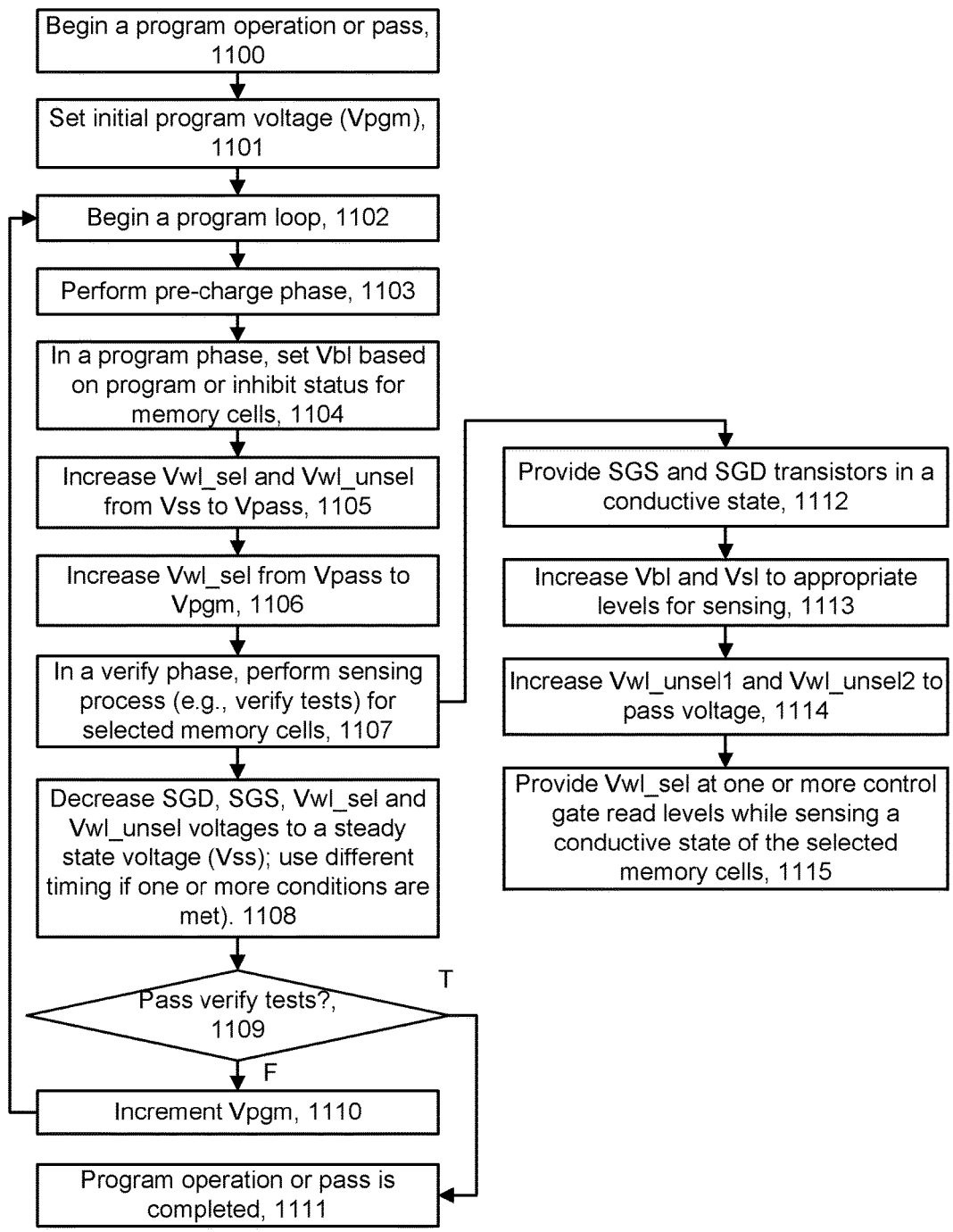
FIG. 11A depicts a flowchart of an example programming process which reduces program disturb.

FIG. 11A depicts a flowchart of an example programming process which reduces program disturb. Step 1100 begins a program operation or pass. In one approach, a programming operation comprises one or more program passes. Step 1101 sets an initial program voltage (Vpgm). See, e.g., FIG. 14 and Vpgm_init. Step 1102 begins a program loop.

Step 1103 performs a pre-charge of the channels of the NAND strings, in a pre-charge phase of a program loop. See FIG. 12 from t0-t2 for further details. In a program phase (see t2-t5 in FIG. 12), step 1104 sets a bit line voltage Vbl based on a program or inhibit status for each memory cell connected to the selected word line in the selected sub-block. A memory cell with an inhibit status has the associated bit line of the NAND string set to a high level, e.g., 2-3 V which inhibits programming. A memory cell with a program status has the associated bit line of the NAND string set to a low level, e.g., 0 V which allows programming. Step 1105 increases Vwl_sel and Vwl_unsel from Vss to Vpass. See FIG. 12 at t2. Note that the pass voltage can be different for different word lines. For example, the pass voltage of Vwl_unsel1 can be different than the pass voltage of Vwl_unsel2. A pass voltage can be a voltage, e.g., 8-10 V, which is applied to the control gate of a memory cell or transistor and is sufficiently high to place the memory cell or transistor in a conductive state, in one approach. Step 1106 increases Vwl_sel from Vpass to Vpgm. See FIG. 12 at t2.

In a verify phase (see t5-t7 in FIG. 12), step 1107 includes performing a sensing process, e.g., one or more verify tests, for the selected memory cells. For example, this can include steps 1112 to 1115. Step 1112 provides the SGS and SGD transistors in a conductive state. Step 1113 increases Vbl and Vsl to appropriate levels for sensing. Step 1114 increases Vwl_unsel1 and Vwl_unsel2 to a pass voltage, Vpass. Vwl_unsel1 and Vwl_unsel2 are examples of Vwl_unsel. Vwl_unsel1 is applied to the non-interface cells, which are spaced apart from other cells by d1, and Vwl_unsel2 is applied to the interface cells, which are spaced apart from each other cells by d2. The interface cells may also be spaced apart from non-interface cells by d1, but the relevant dimension is the largest spacing from an adjacent cell.

Step 1115 provides Vwl_sel at one or more control gate read levels, e.g., verify voltages, while sensing a conductive state of the selected memory cells. See VvA and VvB in FIG. 12. The sensing can involve applying a voltage at one or more control gate read levels to the selected memory cells via the selected word line while applying a read pass voltage to unselected word lines while sensing the memory cells. The sensing of a memory cell can involve detecting a level of a current in the associated NAND string. The verify test determines whether each selected memory cell is in a conductive or non-conductive state.

Step 1108 decreases the SGD, SGS, Vwl_sel and Vwl_unsel voltages to a steady state voltage (Vss) such as 0 V. See FIG. 12 at t8-t12. This may be considered to be a voltage decrease phase of a program loop. The timing of the decrease of Vwl_unsel1 can differ from the timing of the decrease of Vwl_unsel2 if one or more conditions are met, as discussed further in connection with FIG. 11B.

A decision step 1109 determines if the verify tests are passed. If the decision is true, the program operation or pass is completed at step 1111. If the decision step is false, step 1110 increments Vpgm and another program loop begins at step 1102. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the NAND string exceeding a specified level as measured by a decay in the bit line voltage.

The steps depicted are not necessarily performed sequentially in the order shown. Instead, some steps can overlap.

Figure 11B:
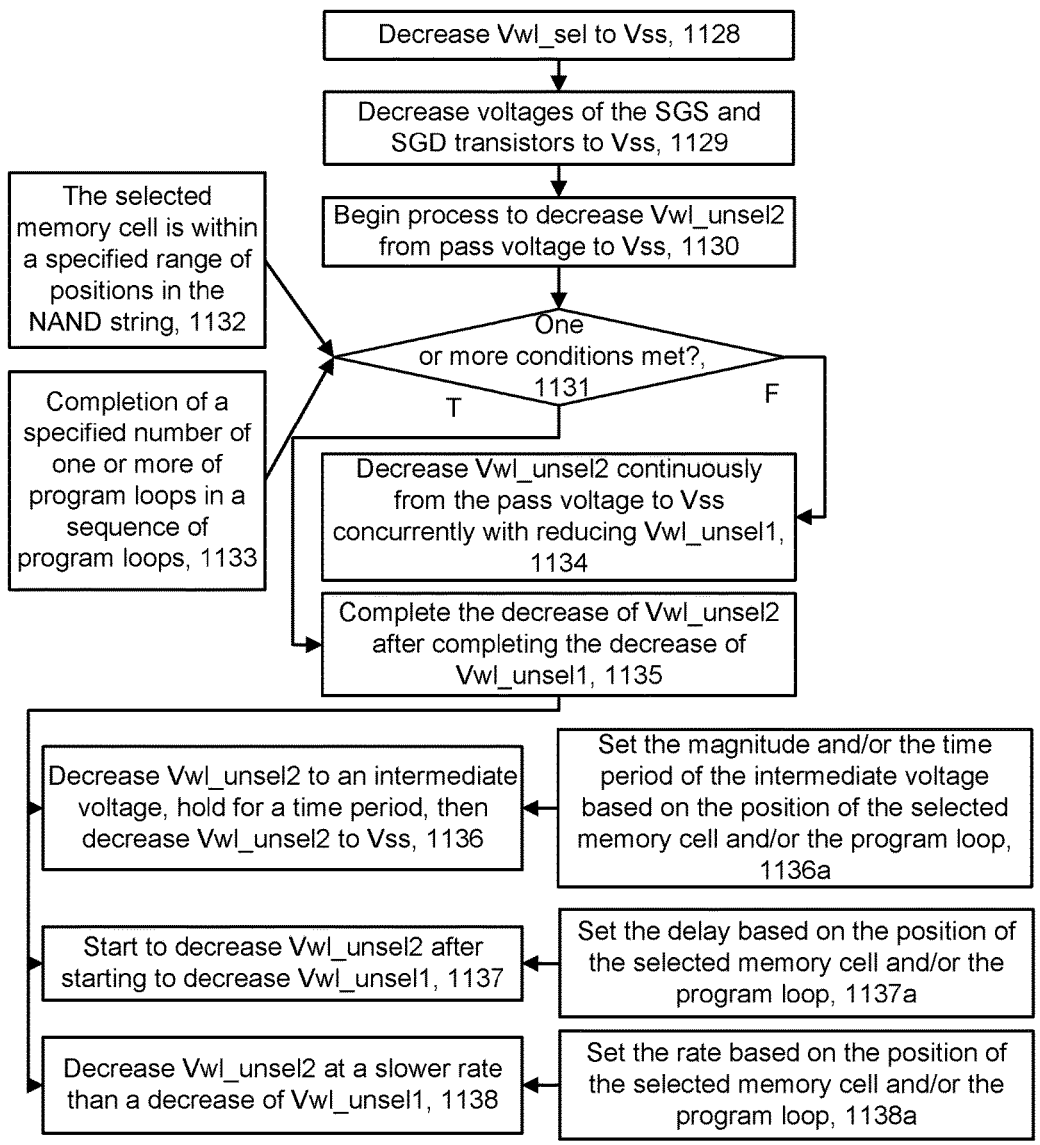
FIG. 11B depicts a flowchart of an example process for decreasing the voltages in step 1108 of FIG. 11A.

FIG. 11B depicts a flowchart of an example process for decreasing the voltages in step 1108 of FIG. 11A. Step 1128 decreases Vwl_sel from the final control gate read level to Vss, in one approach. Optionally, Vwl_sel is increased from the final control gate read voltage to a level such as Vpass before being decreased to Vss. This can help avoid channel gradients which cause disturbs. Step 1129 decreases voltages of the SGS and SGD transistors to Vss.

Considering the negative impact of the residual channel electrons after program verify, techniques are provided which modify the voltage of the unselected word lines at the end of a program loop. In a comparative example, at the end of the current program loop, the pass voltages of the unselected word lines are ramped down together to a low bias level, e.g., Vss, before starting the next program loop. In one aspect of a program disturb countermeasure, instead of ramping down all biases to a low level together, the biases on the word lines at the interface between the top and bottom tiers are ramped down to an intermediate voltage first and kept at that level for a specified time period before being ramped down to the low bias. This intermediate voltage is set based on the gate bias needed to turn on the channel region at the interface. In this way, the channel electrons in the lower tier can pass through the channel region at the interface and leave the channel through SGD side over a longer period of time, compared to a direct ramp down from the pass voltage to Vss. In another aspect, the start of the decrease of the word line voltages at the interface is delayed relative to the start of the decrease of the non-interface word line voltages. In another aspect, the rate of decrease of the word line voltages at the interface is slower than the rate of decrease of the non-interface word line voltages. These approaches also provide the channel region at the interface in a conductive state for a longer period of time after the verify test.

In one approach, the program disturb countermeasures are provided as a function of the position of the selected memory cell in a NAND string, e.g., based on the proximity of the selected memory cell to the source end of the NAND string or to the source end of a block or set of NAND strings, or based the position of the selected word line in a set of word lines. The program disturb countermeasures can be used when the selected memory cell is in the lower or bottom tier but not in the upper or top tier or other higher tier, in one approach. Also, the strength of the program disturb countermeasure can be a function of the position of the selected memory cell or selected word line. For example, the strength can be greater when the selected memory cell or selected word line is closer to the source end of the NAND string since a relatively larger number of residue electrons in the lower tier need to be discharged from the channel via the interface. This could involve the intermediate voltage being held for a relatively longer period of time, the delay in the start of the decrease of the word line voltages at the interface being relatively longer, and/or the rate of the decrease of the word line voltages at the interface being relatively lower.

In an example implementation, step 1130 begins a process to decrease Vwl_unsel2 from the pass voltage to Vss. A decision step 1131 determines whether one or more conditions are met. These are conditions which are relevant to the timing of the decrease of Vwl_unsel2. For example, the input box 1132 indicates whether the selected memory cell is within a specified range of positions in a NAND string. For example, this can a position in the bottom tier of a stack, a position below the interface of a multi-tier stack, or a position otherwise between the interface and the source end of the NAND string, in one approach. As mentioned, the program disturb problem caused by the interface mainly increases program disturb for memory cells connected to WLn in the bottom tier, so one approach is to adjust the timing of the decrease of Vwl_unsel2 to reduce program disturb when WLn is in the bottom tier but not when WLn is in the top tier or otherwise not in the bottom tier. By selectively implementing a timing change in the decrease of Vwl_unsel2 based on a need which is indicted by the position of WLn or the selected memory cell, an associated time penalty can be avoided for other positions of WLn.

The input box 1133 indicates whether there is a completion of a specified number of program loops in a sequence of program loops. This can apply to incremental step pulse programming such as in FIG. 14 where the program voltage Vpgm is a function of the program loop number and is greater as the program loop number becomes greater. Program disturb is greater when Vpgm is greater, so one approach is to adjust the timing of the decrease of Vwl_unsel2 to reduce program disturb when Vpgm is relatively high, e.g., at or above a specified voltage as indicated by the program loop number being at or above a specified program loop number, but not when the program loop number is below the specified program loop number and Vpgm is below the specified voltage. By selectively implementing a timing change in the decrease of Vwl_unsel2 based on a need which is indicted by the program loop number and/or Vpgm, an associated time penalty can be avoided for other values of program loop number and/or Vpgm.

If the decision step 1131 is false, step 1134 decreases Vwl_unsel2 continuously from the pass voltage to Vss concurrently with reducing Vwl_unsel1. See plot 1210c in FIG. 12. If the decision step 1131 is true, step 1135 completes the decrease of Vwl_unsel2 after completing the decreases of Vwl_unsel1, where the decreases are from the pass voltage to Vss. This can involve different approaches.

In a first approach, step 1136 decreases Vwl_unsel2 to an intermediate voltage (Vint), holds Vwl_unsel2 at Vint for a time period, then decreases Vwl_unsel2 from Vint to Vss. See FIG. 12 and plot 1210e. This is an example of a step decrease of Vwl_unsel2. One or more steps can be used. Vint can be sufficiently high to keep the channel region adjacent to the interface in a conductive state. In the example of FIG. 10A, where a voltage of 4 V was considered to be a cutoff voltage for the interface channel region, Vint could be a higher value such as 5 V, for example. Moreover, by lowering Vwl_unsel2 from a pass voltage of 8-10 V for instance, to 5 V, there is a reduced chance of a channel gradient which creates disturbs. A channel gradient is created when the voltages on adjacent memory cells or word lines are significantly different from one another and those voltages are coupled to the respective channel regions of the adjacent memory cells. By holding Vwl_unsel2 at Vint instead of Vpass, where Vint<Vpass, the difference compared to Vss=0 V is reduced. In FIG. 10A, a channel gradient between the memory cells 711 and 712, and between the memory cells 713 and 714 is reduced by this technique.

An input box 1136a can set the magnitude and/or the time period of the intermediate voltage based on the position of the selected memory cell and/or the program loop. See FIGS. 13A and 13B. For instance, Vint can be relatively greater when WLn is relatively closer to the source end of the NAND string because the electrons on the source side of WLn have a relatively longer distance to travel to reach the drain end of the NAND string where they can exit the channel. Also, there is a relatively larger number of electrons which need to travel through the interface travel to reach the drain end. Vint can also be relatively greater when the program loop number and Vpgm are relatively greater because program disturb is relatively worse in this situation.

In a second approach, step 1137 starts to decrease Vwl_unsel2 after starting to decrease Vwl_unsel1. See FIG. 12 and plot 1210d. Thus, there is a delay (the time period t11-t8 in FIG. 12) in the start of the decrease of Vwl_unsel2 relative to the start of the decrease of Vwl_unsel1. An input box 1137a can set the delay based on the position of the selected memory cell and/or the program loop. See FIGS. 13C and 13D. For instance, the delay can be relatively greater when WLn is relatively closer to the source end of the NAND string. The delay can also be relatively greater when the program loop number and Vpgm are relatively greater because program disturb is relatively worse in this situation.

In a third approach, step 1138 decreases Vwl_unsel2 at a lower rate than a decrease of Vwl_unsel1. That is, the decrease is slower for Vwl_unsel2 than for Vwl_unsel1. See FIG. 12 and plot 1210f (low rate or slow decrease) and plot 1210c (high rate or fast decrease). This may refer to a decrease from Vpass to Vss. An input box 1138a can set the rate based on the position of the selected memory cell and/or the program loop. See FIGS. 13E and 13F. For instance, the rate can be relatively smaller when WLn is relatively closer to the source end of the NAND string. The rate can also be relatively smaller when the program loop number and Vpgm are relatively greater because program disturb is relatively worse in this situation. A relatively lower rate of decrease results in a relatively longer delay of the cutoff of the channel region at the interface.

Combinations of the above approaches such as those in steps 1136 to 1138 can be used as well. For example, the intermediate voltage of step 1136 or the slowed rate of step 1138 can be combined with the delayed decrease of step 1137.

FIG. 12 depicts plots of voltages which can be used in a program loop of a program operation, consistent with FIGS. 11A and 11B. The vertical dimension denotes voltage and the horizontal dimension denotes time, with time points t0-t12. The period of time depicted corresponds to one program loop and includes a pre-charge phase 1290 (t0-t2), a program phase 1291 (t2-t5) and a verify phase 1292 (t5-t7). The period from t8-t12 may be considered to be a voltage decrease phase of a program loop. A plot 1200 represents Vwl_sel, a plot 1210 represents Vwl_unsel, a plot 1220 represents Vsgd and Vsgs, and a plot 1230 represents Vbl.

In the pre-charge phase, a positive Vbl (plot 1230a) is provided to the channels of the NAND strings to remove residue electrons and to provide a small amount of boosting such as 1-2 V. The SGD transistors of the selected sub-block (SGD_sel) and unselected sub-block (SGD_unsel) are in a conductive state at this time, with a voltage of 7 V, for example (plot 1220a). This allows the bit line voltage to be passed to the channel.

In the program phase, Vwl_sel and Vwl_unsel are ramped up at t2. This ramp up provides a capacitive coupling up of the channels of the unselected NAND strings. Vwl_sel is then ramped up further at t3 to the peak level of Vpgm. After the program voltage or pulse from t3-t4, Vwl is ramped down to Vss. Subsequently, in the verify phase, one or more verify tests are performed by applying one or more control gate read voltages (plot 1201) on WLn and, for each read voltage, sensing the conductive state of the memory cells in the selected strings of the selected sub-block.

During the program and verify phases, Vsgd/sgs_sel can be set to, e.g., 2 V and 7 V, respectively, for the selected sub-block (plot 1220b). During the program pulse, this voltage is high enough to provide the SGD_sel transistors in a conductive state for the selected NAND strings in the selected sub-block. However, it is low enough that the SGD_sel transistors can be provided in a non-conductive state for the locked out NAND strings in the selected sub-block, by setting a high Vbl for those NAND strings. During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsgd/sgs_unsel is decreased to a reduced level such as 0 V (plot 1220c) which provides the SGD_unsel and SGS_unsel transistors in a non-conductive state for the NAND strings in the unselected sub-blocks. After the verify phase, at t7, Vbl is decreased to 0 V so that the SGD transistors are cutoff and the channel region 1005 of FIG. 10A has a floating voltage. When Vsgd_sel subsequently decreases from 7 V to 0 V, the channel region is coupled down to −2 V, as discussed in connection with FIGS. 10A and 10B due to the Vth=2 V for the SGD transistors.

During the program and verify phases, Vbl can remain high at 2 V for the unselected NAND strings (plot 1230*b*) or set low to 0 V (plot 1230*c*) for the selected NAND strings.

After the verify phase, and starting at t8, various options are depicted in plot 1210 for the decrease of Vwl_unsel. A plot 1210*c* depicts a continuous decrease starting at t8 at a relatively high rate, with no delay relative to t8. The duration of the decrease from Vpass to Vss is t10-t8. This decrease may involve a control instructing the voltage driver to make a step change in the voltage at t8. The actual change in the voltage will not be immediate due to an RC time constant.

A plot 1210*d* depicts a continuous decrease starting at t11 at a relatively high rate, with a delay of t11-t8 relative to t8. The duration of the decrease from Vpass to Vss is t12-t11. This decrease may involve a control instructing the voltage driver to make a step change in the voltage at t11.

A plot 1210*f* depicts a continuous decrease starting at t8 at a relatively low rate, with no delay relative to t8. The duration of the decrease from Vpass to Vss is t12-t8. This decrease may involve a control instructing the voltage driver to make continuous changes in the voltage from t8 to t12.

A plot 1210*e* depicts a decrease from Vpass to Vint from t8-t9, a hold at Vint in a time period from t9-t11, and a decrease from Vint to Vss from t11-t12. This decrease may involve a control instructing the voltage driver to make a step change in the voltage from Vpass to Vint at t8, holding the voltage at Vint from t8 to t11, and a step change from Vint to Vpass at t11.

In the example of step 1136 of FIG. 11C, plot 1210*c* may be used for Vwl_unsel1 and plot 1210*e* may be used for Vwl_unsel2. In the example of step 1137 of FIG. 11C, plot 1210*c* may be used for Vwl_unsel1 and plot 1210*e* may be used for Vwl_unsel2. In the example of step 1138 of FIG. 11C, plot 1210*c* may be used for Vwl_unsel1 and plot 1210*d* may be used for Vwl_unsel2.

Figure 13A:
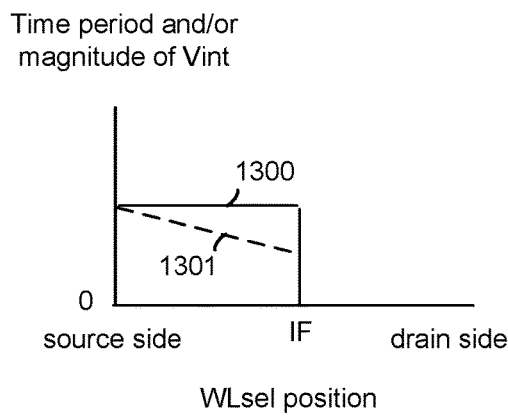
FIG. 13A depicts a plot of the time period and/or magnitude of the intermediate voltage (Vint) as a function of the selected word line position, consistent with the input box 1136a of FIG. 11C.

FIG. 13A depicts a plot of the time period and/or magnitude of the intermediate voltage (Vint) as a function of the selected word line position, consistent with the input box 1136*a* of FIG. 11C. WLsel (selected word line) position ranges from a source side to a drain side of a set of word lines in a stack. Plot 1300 shows that the time period or magnitude can be a fixed positive value when WLsel is between the source side and the interface (IF). Plot 1301 shows that the time period or magnitude can be set to be relatively higher when WLsel is between the source side and the interface (IF) and is relatively closer to the source side. The step down to the intermediate voltage for Vwl_unsel2 can be omitted when WLsel is between the drain side and the IF. Plot 1300 provides a simpler implementation while plot 1301 provides a finer grained approach.

Figure 13B:
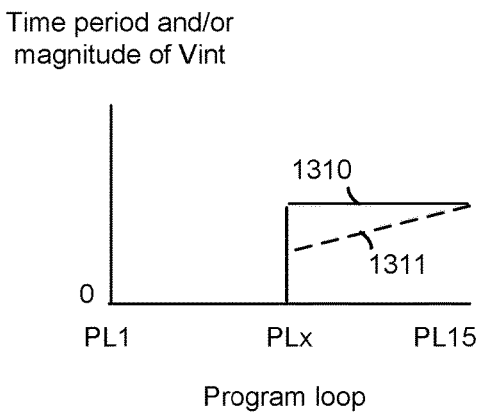
FIG. 13B depicts a plot of the time period and/or magnitude of the intermediate voltage as a function of the program loop, consistent with the input box 1136a of FIG. 11C.

FIG. 13B depicts a plot of the time period and/or magnitude of the intermediate voltage as a function of the program loop, consistent with the input box 1136*a* of FIG. 11C. The program loop position or number ranges from a first program loop PL1 (loop number 1) to a last program loop, e.g., PL15 (loop number 15) in this example, consistent with FIG. 14. Plot 1310 shows that the time period or magnitude can be a fixed positive value when the program loop is at or above a specified program loop PLx, e.g., PL8. Plot 1311 shows that the time period or magnitude can be set to be relatively higher when the program loop (and Vpgm) are relatively higher. The step down to the intermediate voltage for Vwl_unsel2 can be omitted when the program loop is below PLx. Plot 1310 provides a simpler implementation while plot 1311 provides a finer grained approach. Note that the horizontal axis can also represent Vpgm, which increases with the program loop number. For example, the time period or magnitude can be a fixed or increasing positive value when the current Vpgm is at or above a specified Vpgm. The program loop number represents the sequential position of a current program loop in a sequence of program loops. A relatively high program loop number means the program loop is relatively later in the sequence of program loops.

In one approach, PLx is known before the program operation and is set to a fixed value. In another approach, PLx is not known and is determined adaptively based on the programming progress. For example, PLx can be a program loop in which a specified portion of memory cells reach the verify voltage for a specified assigned data state. For example, in FIG. 4, in PL8, all or most of the A-state cells have reached the A state such that the verify test for the A state is no longer used in the following program loops. This could be a trigger for implementing the change in timing of Vwl_unsel2 vs. Vwl_unsel1.

Figure 13C:
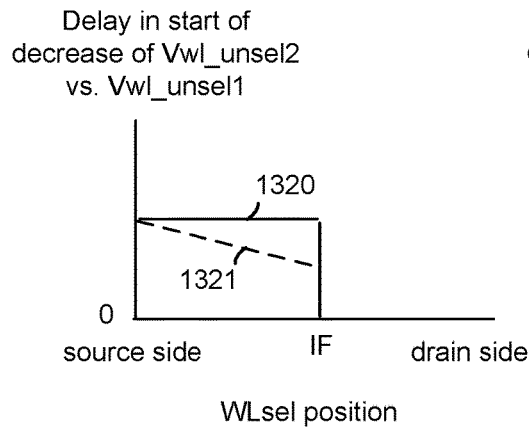
FIG. 13C depicts a plot of a delay in the start of the decrease of Vwl_unsel2 versus the start of the decrease of Vwl_unsel1 as a function of the selected word line position, consistent with the input box 1137a of FIG. 11C.

FIG. 13C depicts a plot of a delay in the start of the decrease of Vwl_unsel2 versus the start of the decrease of Vwl_unsel1 as a function of the selected word line position, consistent with the input box 1137*a* of FIG. 11C. The horizontal axis depicts WLsel as in FIG. 13A. Plot 1320 shows that the delay can be a fixed positive value when WLsel is between the source side and the interface (IF). Plot 1321 shows that the delay can be set to be relatively higher when WLsel is between the source side and the interface (IF) and is relatively closer to the source side. The step down to the intermediate voltage for Vwl_unsel2 can be omitted when WLsel is between the drain side and the IF. Plot 1320 provides a simpler implementation while plot 1321 provides a finer grained approach.

Figure 13D:
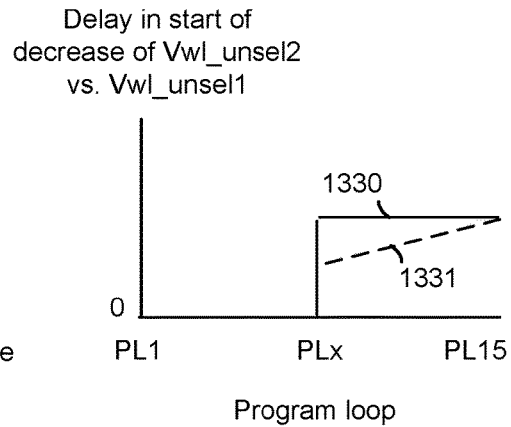
FIG. 13D depicts a plot of a delay in the start of the decrease of Vwl_unsel2 versus the start of the decrease of Vwl_unsel1 as a function of the program loop, consistent with the input box 1137a of FIG. 11C.

FIG. 13D depicts a plot of a delay in the start of the decrease of Vwl_unsel2 versus the start of the decrease of Vwl_unsel1 as a function of the program loop, consistent with the input box 1137*a* of FIG. 11C. The horizontal axis depicts program loop number as in FIG. 13B. Plot 1330 shows that the delay can be a fixed positive value when the program loop is at or above a specified program loop PLx. Plot 1331 shows that the delay can be set to be relatively higher when the program loop (and Vpgm) are relatively higher. The step down to the intermediate voltage for Vwl_unsel2 can be omitted when the program loop is below PLx. Plot 1330 provides a simpler implementation while plot 1331 provides a finer grained approach. As before, the horizontal axis can also represent Vpgm which increases with the program loop number. For example, the delay can be a fixed or increasing positive value when the current Vpgm is at or above a specified Vpgm.

Figure 13E:
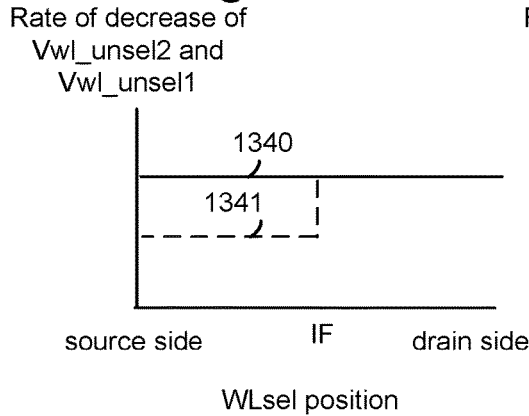
FIG. 13E depicts a plot of the rate of decrease of the unselected word line voltages Vwl_unsel1 and Vwl_unsel2 as a function of the selected word line position, consistent with the input box 1138a of FIG. 11C.

FIG. 13E depicts a plot of the rate of decrease of the unselected word line voltages Vwl_unsel1 and Vwl_unsel2 as a function of the selected word line position, consistent with the input box 1138*a* of FIG. 11C. The horizontal axis depicts WLsel as in FIG. 13A. Plot 1340 shows a relatively high rate is used for all values of WLsel. Plot 1341 shows the option to use a relatively low rate for Vwl_unsel2 when WLsel is between the source side and the interface IF.

Figure 13F:
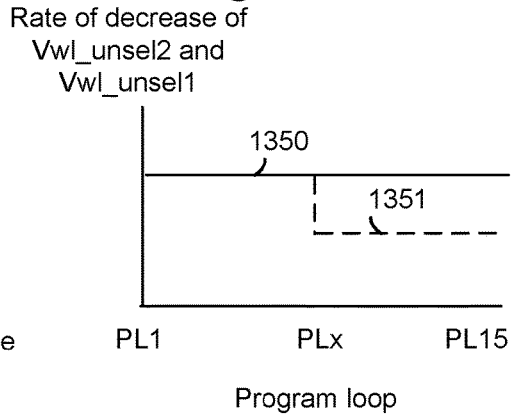
FIG. 13F depicts a plot of the rate of decrease of the unselected word line voltages Vwl_unsel1 and Vwl_unsel2 as a function of the program loop, consistent with the input box 1138a of FIG. 11C.

FIG. 13F depicts a plot of the rate of decrease of the unselected word line voltages Vwl_unsel1 and Vwl_unsel2 as a function of the program loop, consistent with the input box 1138*a* of FIG. 11C. The horizontal axis depicts program loop number as in FIG. 13B. Plot 1350 shows that a relatively high rate can be used for all program loop numbers. Plot 1351 shows the option to use a relatively low rate when the program loop is above PLx. As before, the horizontal axis can also represent Vpgm which increases with the program loop number. For example, a relatively low rate can be used when the current Vpgm is at or above a specified Vpgm.

FIG. 14 depicts a series of program loops in an example programming operation, consistent with FIG. 11A. The pulse train 1400 includes a series of program pulses 1401-1415 that are applied to a word line selected for programming. The pulse train 1400 is an example of a second set of step-wise increasing program voltages. One, two or three verify pulses are provided after each program pulse as an example, based on the assigned data states which are being verified. For example, an A-state verify pulse 1420 (VvA) is applied in program loops 1-3, A-state and B-state verify pulses 1421 (VvA and VvB, respectively) are applied in program loops 4-6, A-state, B-state and C-state verify pulses 1422 (VvA, VvB and VvC, respectively) are applied in program loops 7 and 8, B-state and C-state verify pulses 1423 are applied in program loops 9-11, and a C-state verify pulse 1424 is applied in program loops 12-15.

A pulse train typically includes program pulses which increase stepwise in amplitude in one or more program loops or program loops of a programming pass using a fixed or varying step size. In some cases, the program pulses increase in each program loop after the first. This is an example of incremental step pulse programming. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

Figure 15:
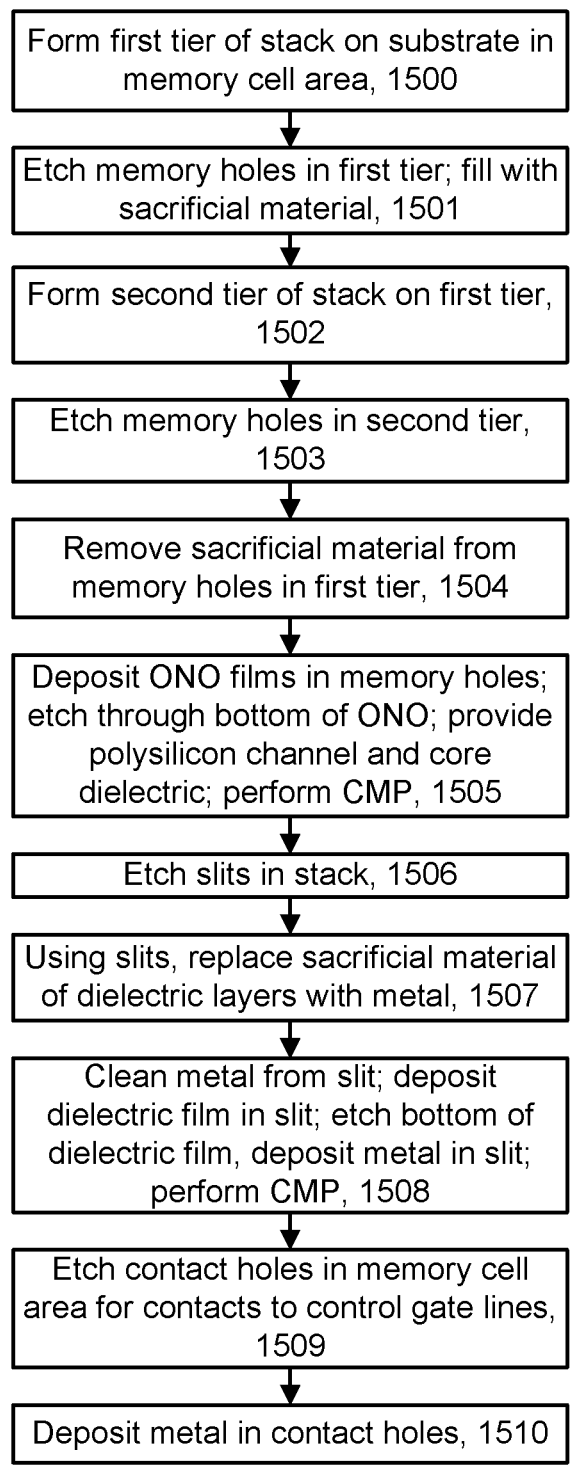
FIG. 15 depicts an example fabrication process for a semiconductor stack comprising two tiers.

FIG. 15 depicts an example fabrication process for a semiconductor stack comprising two tiers. The process can be extended to form more than two tiers. Step 1500 includes forming a first tier of a stack on a substrate in a memory cell area. Step 1501 includes etching memory holes in the first tier, and filling the memory holes with a sacrificial material, such as SiN. See, e.g., FIG. 16A.

Step 1502 includes forming a second tier of the stack on the first tier. Step 1503 includes etching memory holes in the second tier. See, e.g., FIG. 16B. Step 1504 includes removing the sacrificial material from the memory holes in the first tier, e.g., using a wet etch. See, e.g., FIG. 16C.

Step 1505 includes depositing oxide-nitride oxide (ONO) films in the memory holes. See, e.g., FIG. 16D. Step 1506 includes etching slits in the stack. See, e.g., FIG. 16E. Step 1507 includes using the slits to replace the sacrificial material of the dielectric layers of the stack with metal. This can involve providing an etchant via the slit which removes the sacrificial material, creating voids, then providing metal via the slit which fills the voids.

Step 1508 includes cleaning metal from the slit, depositing a dielectric film in the slit which coast the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 16F.

Step 1509 includes etching contact holes in the memory cell area for contacts to the control gate lines. See, e.g., FIG. 16G. Step 1510 includes depositing metal in the contact holes. See, e.g., FIG. 16G.

Note that some of the steps can be performed in a different order than the order shown in FIG. 15.

FIG. 16A depicts a semiconductor structure 1600 in a configuration which is consistent with steps 1500 and 1501 of FIG. 15. The structure includes a memory cell area of a substrate 1601. A peripheral area, not shown, may also be fabricated at the same time. The substrate comprises an intrinsic silicon region 1602, a deep n-well 1603 and a p-well 1604, for instance. A first tier 1605 of a stack includes alternating dielectric layers and control gate layers. The control gate layers may comprise a sacrificial material at this stage of the fabrication. An example dielectric layer 1606 and an example control gate layer 1607 are depicted. This example includes nine control gate layers in the tier. A dielectric layer 1608 extends on top of the stack while a dielectric layer 1609 extends on top of the semiconductor structure. The dielectric layer 1608 may be, e.g., SiOx deposited by LPCVD or PECVD, for instance. The dielectric layer 1609 may be, e.g., SiN deposited by low pressure chemical vapor deposition (LPCVD) or plasma-enhanced chemical vapor deposition (PECVD), for instance.

The semiconductor structure includes a plurality of memory holes which are etched in the tier. An example memory hole 1610 (also referred to as a column or pillar when the memory hole is filled) includes a widened top portion 1611 above an elongated portion 1612. A source side region 1613 is below the memory hole. A top 1614 and a bottom 1615 of the stack are also depicted. A coordinate system shows x, y and z (vertical) directions.

FIG. 16B depicts a semiconductor structure 1620 in a configuration which is consistent with steps 1502 and 1503 of FIG. 15. A second (top) tier 1616 of the stack is formed on the first tier and also includes alternating dielectric layers and control gate layers. An interface IF at the top of the first tier separates the top and bottom tiers. An example dielectric layer 1621 and an example control gate layer 1622 are depicted. This example includes nine control gate layers in the tier. A dielectric layer 1623 extends on top of the semiconductor structure 1620 which comprises a stack 1626 of alternating dielectric layers and control gate layers.

Memory holes, including an example memory hole 1624 are etched in the second tier of the stack. These memory holes are aligned with the sacrificial material in the memory holes in the first tier (e.g., example sacrificial material 1625). In some cases there is a misalignment between the memory holes in the top and bottom tiers. The widened top portion 1611 provides an increased area for the memory hole in the top tier to contact, to ensure that the memory holes are connected to provide a continuous memory hole through both tiers.

FIG. 16C depicts a semiconductor structure 1630 in a configuration which is consistent with step 1504 of FIG. 15. Once the sacrificial material in the first tier is removed, continuous memory holes, such as an example continuous memory hole 1631, are formed which extend through both tiers, from the top of the stack to the bottom of the stack. The continuous memory hole 1631 comprises the memory hole 1632 (or memory hole portion) of the first tier and the memory hole 1624 (or memory hole portion) of the second tier.

FIG. 16D depicts a semiconductor structure 1640 in a configuration which is consistent with step 1505 of FIG. 15. The memory holes are filled with materials such as ONO films, a polysilicon channel and a core dielectric. To provide the polysilicon channel, amorphous silicon may be deposited follow by a heating step. This results in a column 1641 (e.g., pillar) comprising a column 1642 in the second tier above a column 1643 in the first tier.

FIG. 16E depicts a semiconductor structure 1650 in a configuration which is consistent with step 1506 of FIG. 15. Slits, including an example slit 1651, are formed periodically in the y direction in the stack. Each slit may have a uniform cross-section in the y-z plane and extend across the stack in the x direction.

FIG. 16F depicts a semiconductor structure 1660 in a configuration which is consistent with steps 1507 and 1508 of FIG. 15. By providing an etchant in the slits, the sacrificial material of the control gate layers is removed. Voids created in the control gate layers are subsequently filled with a metal such as tungsten. For example, a metal (e.g., conductive layer) is provided for the control gate layer 1622. A metal residual is then removed from the slits and a dielectric film 1663 is deposited in the slits, leaving a void in the slit. The void may extend from the p-well at a bottom of the stack to the top of the stack. The slit may be filled with a metal 1672 which provides a metal interconnect to the substrate.

FIG. 16G depicts a semiconductor structure 1670 in a configuration which is consistent with steps 1509 and 1510 of FIG. 15. Contacts holes are etched in the stack outside the area with the memory holes to provide voids which extend upward from terraced edges of control gate layers to the top of the stack. The contact holes are then filled with metal to provide metal vias which connect the control gate layers to the top of the stack. Subsequent processing involves connected metal paths above the stack to the contacts. The metal paths may in turn be connected to voltage sources, for example, or other circuitry. An example via 1671 is connected to the control gate layer 1662. The distances d1 and d2 between memory cells, discussed previously, are also depicted. See also the region 623 in FIG. 6D for a close-up view of the region 623 of the stack.

The semiconductor structure is an example of a three-dimensional structure in which memory cells are arranged in NAND strings.

The stack comprises a plurality of alternating conductive and dielectric layers. The conductive layers are connected to control gates of memory cells and other transistors such as SGD and SGS transistors in each NAND string. In one approach, the conductive layers and associated memory cells in the top and bottom tiers are separate by a distance d1. The conductive layers and associated memory cells which are adjacent to the interface may be separate from one another by a larger distance d2.

In one implementation, an apparatus comprises: a plurality of memory cells arranged in a NAND string, the plurality of memory cells comprise first memory cells spaced apart by a first distance and second memory cells spaced apart by a second distance, larger than the first distance; and a control circuit configured to sense a conductive state of a selected memory cell in the NAND string while applying a pass voltage to the first memory cells and to the second memory cells, and, after sensing the conductive state of the selected memory cell and when one or more conditions are met, complete a decrease of voltages of the second memory cells from the pass voltage to a steady state voltage after completing a decrease of voltages of the first memory cells from the pass voltage to the steady state voltage, wherein the one or more conditions comprise the selected memory cell being within a specified range of positions in the NAND string.

In another implementation, a method comprises: sensing a conductive state of a selected memory cell in a NAND string comprising a plurality of memory cells, the sensing comprises applying a read voltage to the selected memory cell and a pass voltage to remaining memory cells in the NAND string; and after the sensing, ramping down voltages of the remaining memory cells from the pass voltage to a steady state voltage, wherein the remaining memory cells comprise a first memory cell spaced apart from an adjacent memory cell by a first distance and a second memory cell spaced apart from an adjacent memory cell by a second distance which is greater than the first distance, and the ramping down comprises a continuous decrease for a voltage of the first memory cell and a step decrease for a voltage of the second memory cell.

In another implementation, an apparatus comprises: a NAND string comprising a plurality of memory cells; the NAND string extends vertically in a stack of alternating regions comprising a plurality of conductive regions and a plurality of dielectric regions, wherein the conductive regions are connected to control gates of the plurality of memory cells, and a height (d2) of one dielectric region of the plurality of dielectric regions is at least twice a height (d1) of other dielectric regions of the plurality of dielectric regions; means for sensing a conductive state of a selected memory of the plurality of memory cells; means for applying a pass voltage to unselected memory cells of the plurality of memory cells; and means for ramping down voltages of the unselected memory cells from the pass voltage to a steady state voltage, wherein a timing of the ramping is different for an unselected memory cell adjacent to the one dielectric region relative to a timing of the ramping for unselected memory cells adjacent to the other dielectric regions.

The means for sensing may include the control circuitry 110, the sense block 51, the voltage sources 420, or other logic hardware, and/or other executable code stored on a computer readable storage medium or device. Other embodiments may include similar or equivalent means for sensing.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a plurality of memory cells arranged in a NAND string, the plurality of memory cells comprise first memory cells spaced apart by a first distance, second memory cells spaced apart by a second distance, larger than the first distance, and a selected memory cell; and
a control circuit configured to sense a conductive state of the selected memory cell in the NAND string while applying a pass voltage to the first memory cells and to the second memory cells, and, after sensing the conductive state of the selected memory cell and when one or more conditions are met, complete a decrease of voltages of the second memory cells from the pass voltage to a steady state voltage after completing a decrease of voltages of the first memory cells from the pass voltage to the steady state voltage, wherein the one or more conditions comprise the selected memory cell being within a specified range of positions in the NAND string.

2. The apparatus of claim 1, wherein:
to complete the decrease of the voltages of the second memory cells, the control circuit is configured to decrease the voltages of the second memory cells from the pass voltage to an intermediate voltage, to hold the voltages of the second memory cells at the intermediate voltage for a time period, and to decrease the voltages of the second memory cells from the intermediate voltage to the steady state voltage.

3. The apparatus of claim 2, wherein:
to complete the decrease of the voltages of the first memory cells, the control circuit is configured to decrease the voltages of the first memory cells continuously from the pass voltage to the steady state voltage.

4. The apparatus of claim 2, wherein:
the NAND string has a source end and a drain end; and
the time period is relatively larger when the selected memory cell is relatively closer to the source end.

5. The apparatus of claim 2, wherein:
the NAND string has a source end and a drain end; and
a magnitude of the intermediate voltage is relatively larger when the selected memory cell is relatively closer to the source end.

6. The apparatus of claim 2, wherein:
the sensing of the conductive state of the selected memory cell occurs in a verify test in a program loop within a sequence of program loops; and
the time period is relatively larger when the program loop is relatively later in the sequence of program loops.

7. The apparatus of claim 2, wherein:
the sensing of the conductive state of the selected memory cell occurs in a verify test in a program loop within a sequence of program loops; and
a magnitude of the intermediate voltage is relatively larger when the program loop is relatively later in the sequence of program loops.

8. The apparatus of claim 1, wherein:
the sensing of the conductive state of the selected memory cell occurs in a verify test in a program loop within a sequence of program loops; and
the one or more conditions comprise completion of a specified number of one or more of program loops in the sequence of program loops.

9. The apparatus of claim 1, wherein:
to complete the decrease of the voltages of the second memory cells, the control circuit is configured to start to decrease the voltages of the second memory cells from the pass voltage after starting to decrease the voltages of the first memory cells from the pass voltage.

10. The apparatus of claim 1, wherein:
to complete the decrease of the voltages of the second memory cells, the control circuit is configured to decrease the voltages of the second memory cells from the pass voltage at a lower rate than a rate of decrease of the voltages of the first memory cells from the pass voltage.

11. The apparatus of claim 1, wherein:
the NAND string extends vertically in a memory hole in stack of alternating conductive layers and dielectric layers;
the conductive layers are connected to control gates of the plurality of memory cells;
the memory hole comprises an interface at which a diameter of the memory hole widens, partway along a height of the memory hole; and
the second distance spans the interface.

12. The apparatus of claim 11, wherein:
the NAND string has a source end and a drain end; and
the specified range of positions in the NAND string comprise positions between the source end and the interface but not between the drain end and the interface.

13. The apparatus of claim 1, wherein:
the NAND string has a source end and a drain end; and
the specified range of positions in the NAND string comprise positions between the source end and the second memory cells but not between the drain end and the second memory cells.

14. A method, comprising:
sensing a conductive state of a selected memory cell in a NAND string comprising a plurality of memory cells, the sensing comprises applying a read voltage to the selected memory cell and a pass voltage to remaining memory cells in the NAND string; and
after the sensing, ramping down voltages of the remaining memory cells from the pass voltage to a steady state voltage, wherein the remaining memory cells comprise a first memory cell spaced apart from an adjacent memory cell by a first distance and a second memory cell spaced apart from an adjacent memory cell by a second distance which is greater than the first distance, and the ramping down comprises a continuous decrease for a voltage of the first memory cell and a step decrease for a voltage of the second memory cell.

15. The method of claim 14, wherein the step decrease comprises a decrease to an intermediate level which is between the pass voltage and the steady state voltage, the method further comprising:
holding the voltage of the second memory cell at the intermediate level which is based on a position of the second memory cell in the NAND string.

16. The method of claim 14, wherein the step decrease comprises a decrease to an intermediate level which is between the pass voltage and the steady state voltage, the method further comprising:
setting a magnitude of the voltage of the second memory cell at the intermediate level based on a position of the second memory cell in the NAND string.

17. The method of claim 14, wherein:
the sensing of the conductive state of the selected memory cell occurs in a verify test in a program operation.

18. An apparatus, comprising:
a NAND string comprising a plurality of memory cells, the NAND string extends vertically in a stack of alternating regions comprising a plurality of conductive regions and a plurality of dielectric regions, wherein the conductive regions are connected to control gates of the plurality of memory cells, and a height of one dielectric region of the plurality of dielectric regions is at least twice a height of other dielectric regions of the plurality of dielectric regions;
means for sensing a conductive state of a selected memory of the plurality of memory cells;
means for applying a pass voltage to unselected memory cells of the plurality of memory cells; and
means for ramping down voltages of the unselected memory cells from the pass voltage to a steady state voltage, wherein a timing of the ramping is different for an unselected memory cell adjacent to the one dielectric region relative to a timing of the ramping for unselected memory cells adjacent to the other dielectric regions.

19. The apparatus of claim 18, wherein:

the ramping for the unselected memory cell adjacent to the one dielectric region comprise a step decrease to an intermediate level which is between the pass voltage and the steady state voltage and the ramping for the unselected memory cells adjacent to the other dielectric regions comprises a continuous decrease from the pass voltage to the steady state voltage.

20. The apparatus of claim 18, wherein:

a start of the ramping for the unselected memory cell adjacent to the one dielectric region is after a start of the ramping for the unselected memory cells adjacent to the other dielectric regions.

\* \* \* \* \*